(12) United States Patent
Nakamura et al.

(10) Patent No.: US 8,592,841 B2
(45) Date of Patent: *Nov. 26, 2013

(54) NITRIDE SEMICONDUCTOR DEVICE

(75) Inventors: Shuji Nakamura, Tokushima (JP);
Takashi Mukai, Tokushima (JP); Koji Tanizawa, Tokushima (JP); Tomotsugu Mitani, Tokushima (JP); Hiroshi Marui, Tokushima (JP)

(73) Assignee: Nichia Corporation, Anan-shi (JP)

( * ) Notice: Subject to any disclaimer, the term of this patent is extended or adjusted under 35 U.S.C. 154(b) by 591 days.

This patent is subject to a terminal disclaimer.

(21) Appl. No.: 12/068,063

(22) Filed: Feb. 1, 2008

(65) Prior Publication Data

US 2008/0149955 A1 Jun. 26, 2008

Related U.S. Application Data

(62) Division of application No. 09/463,643, filed on May 1, 2000, now Pat. No. 7,365,369.

(30) Foreign Application Priority Data

| Jul. 25, 1997 | (JP) | 9-199471 |
| Sep. 1, 1997 | (JP) | 9-235524 |
| Oct. 20, 1997 | (JP) | 9-286304 |
| Nov. 6, 1997 | (JP) | 9-304328 |
| Nov. 18, 1997 | (JP) | 9-317421 |
| Dec. 18, 1997 | (JP) | 9-348972 |
| Dec. 18, 1997 | (JP) | 9-348973 |
| Feb. 4, 1998 | (WO) | PCT/JP98/03336 |
| Jun. 8, 1998 | (JP) | 10-176623 |
| Jun. 8, 1998 | (JP) | 10-176634 |
| Jun. 29, 1998 | (JP) | 10-199829 |

(51) Int. Cl.
*H01L 33/00* (2010.01)

(52) U.S. Cl.
USPC .... 257/96; 257/97; 257/E33.063; 257/E33.017; 257/99

(58) Field of Classification Search
USPC .................................................. 257/96
See application file for complete search history.

(56) References Cited

U.S. PATENT DOCUMENTS

| 3,566,215 A | 2/1971 | Heywang | 317/235 |
| 3,593,191 A | 7/1971 | Henker | 331/94.5 |

(Continued)

FOREIGN PATENT DOCUMENTS

| CA | 1325582 | 12/1993 |
| DE | 43 36 891 A1 | 5/1994 |

(Continued)

OTHER PUBLICATIONS

Translation of JP 08-008247.*

(Continued)

*Primary Examiner* — Jerome Jackson, Jr.
(74) *Attorney, Agent, or Firm* — Nixon & Vanderhye PC (57) ABSTRACT

A nitride semiconductor device used chiefly as an LD and an LED element. In order to improve the output and to decrease Vf, the device is given either a three-layer structure in which a nitride semiconductor layer doped with n-type impurities serving as an n-type contact layer where an n-electrode is formed is sandwiched between undoped nitride semiconductor layers; or a superlattice structure of nitride. The n-type contact layer has a carrier concentration exceeding $3\times10^{10}$ $cm^3$, and the resistivity can be lowered below $8\times10^{-3}$ Ωcm.

9 Claims, 1 Drawing Sheet

(56) References Cited

U.S. PATENT DOCUMENTS

| | | | |
|---|---|---|---|
| 3,655,439 A | 4/1972 | Seiter | 117/212 |
| 3,658,585 A | 4/1972 | Folkmann et al. | 117/201 |
| 3,704,427 A | 11/1972 | Heywang | 331/94.5 |
| 3,705,567 A | 12/1972 | Emels | 118/49 |
| 3,737,737 A | 6/1973 | Heywang et al. | 317/234 R |
| 3,747,559 A | 7/1973 | Dietze | 118/48 |
| 3,793,984 A | 2/1974 | Kasper et al. | 118/48 |
| 3,819,974 A | 6/1974 | Stevenson et al. | 313/499 |
| 3,853,974 A | 12/1974 | Reuschel et al. | 264/81 |
| 3,941,647 A | 3/1976 | Druminski | 156/612 |
| 3,948,693 A | 4/1976 | Weyrich et al. | 148/171 |
| 3,963,537 A | 6/1976 | Kniepkamp et al. | 148/175 |
| 3,965,347 A | 6/1976 | Heywang | 250/211 J |
| 3,974,561 A | 8/1976 | Schnoeller | 29/611 |
| 4,020,791 A | 5/1977 | Reuschel et al. | 118/49.1 |
| 4,062,035 A | 12/1977 | Winstel | 357/17 |
| 4,098,223 A | 7/1978 | Ertl et al. | 118/48 |
| 4,102,298 A | 7/1978 | Dietze et al. | 118/5 |
| 4,108,539 A | 8/1978 | Gort et al. | 350/201 |
| 4,113,381 A | 9/1978 | Epstein | 356/5 |
| 4,133,702 A | 1/1979 | Krimmel | 148/1.5 |
| 4,140,546 A | 2/1979 | Krimmel | 148/1.5 |
| 4,154,625 A | 5/1979 | Golovchenko et al. | 148/1.5 |
| 4,170,018 A | 10/1979 | Runge | 357/17 |
| 4,261,770 A | 4/1981 | Splittgerber et al. | 148/171 |
| 4,351,695 A | 9/1982 | Hieber et al. | 156/603 |
| 4,404,265 A | 9/1983 | Manasevit | 428/689 |
| 4,410,993 A | 10/1983 | Zschauer | 372/44 |
| 4,423,349 A | 12/1983 | Nakajima et al. | 313/487 |
| 4,505,765 A | 3/1985 | Trommer | 148/171 |
| 4,521,448 A | 6/1985 | Sasaki | 427/88 |
| 4,531,142 A | 7/1985 | Weyrich et al. | 357/17 |
| 4,568,206 A | 2/1986 | Imazaike | 384/530 |
| 4,596,998 A | 6/1986 | Krimmel | 357/17 |
| 4,599,244 A | 7/1986 | Falckenberg et al. | 427/74 |
| 4,599,245 A | 7/1986 | Falckenberg et al. | 427/74 |
| 4,604,637 A | 8/1986 | Ruhle et al. | 357/17 |
| 4,615,766 A | 10/1986 | Jackson et al. | 156/662 |
| 4,656,636 A | 4/1987 | Amann et al. | 372/50 |
| 4,661,175 A | 4/1987 | Kuphal et al. | 148/171 |
| 4,670,093 A | 6/1987 | Maerz et al. | 156/649 |
| 4,682,337 A | 7/1987 | Amann | 372/44 |
| 4,683,574 A | 7/1987 | Heinen | 372/44 |
| 4,722,088 A | 1/1988 | Wolf | 372/44 |
| 4,740,259 A | 4/1988 | Heinen | 156/234 |
| 4,742,525 A | 5/1988 | Heinen et al. | 372/44 |
| 4,744,088 A | 5/1988 | Heinen et al. | 372/50 |
| 4,746,195 A | 5/1988 | Auracher et al. | 350/320 |
| 4,763,979 A | 8/1988 | Heywang | 350/96.2 |
| 4,768,199 A | 8/1988 | Heinen et al. | 372/36 |
| 4,792,200 A | 12/1988 | Amann et al. | 350/96.12 |
| 4,792,959 A | 12/1988 | Mueller et al. | 372/46 |
| 4,818,722 A | 4/1989 | Heinen | 437/129 |
| 4,829,188 A | 5/1989 | Shinomiya et al. | 250/483.1 |
| 4,835,575 A | 5/1989 | Plihal | 357/30 |
| 4,841,344 A | 6/1989 | Heinen | 357/17 |
| 4,845,723 A | 7/1989 | Heinen et al. | 372/38 |
| 4,855,118 A | 8/1989 | Ichinose et al. | 423/301 |
| 4,859,903 A | 8/1989 | Minematu et al. | 313/499 |
| 4,864,369 A | 9/1989 | Snyder et al. | 357/17 |
| 4,869,568 A | 9/1989 | Schimpe | 350/96.12 |
| 4,890,033 A | 12/1989 | Ichinomiya et al. | 313/487 |
| 4,904,617 A | 2/1990 | Muschke | 437/129 |
| 4,904,618 A | 2/1990 | Neumark | 437/150 |
| 4,907,044 A | 3/1990 | Schellhorn et al. | 357/17 |
| 4,907,534 A | 3/1990 | Huang et al. | 118/725 |
| 4,911,102 A | 3/1990 | Manabe et al. | 118/719 |
| 4,918,497 A | 4/1990 | Edmond | 357/17 |
| 4,929,907 A | 5/1990 | Berkel | 330/252 |
| 4,944,837 A | 7/1990 | Nishikawa et al. | 156/646 |
| 4,945,394 A | 7/1990 | Palmour et al. | 357/34 |
| 4,946,547 A | 8/1990 | Palmour et al. | 156/643 |
| 4,947,218 A | 8/1990 | Edmond et al. | 357/13 |
| 4,959,174 A | 9/1990 | Nakajima et al. | 252/301.6 R |
| 4,960,728 A | 10/1990 | Schaake et al. | 437/82 |
| 4,966,862 A | 10/1990 | Edmond | 437/100 |
| 4,971,739 A | 11/1990 | Ichinose et al. | 264/61 |
| 4,977,567 A | 12/1990 | Hanke | 372/45 |
| 4,982,314 A | 1/1991 | Miki | 363/16 |
| 4,985,742 A | 1/1991 | Pankove | 357/34 |
| 4,987,576 A | 1/1991 | Heinen | 372/46 |
| 4,990,466 A | 2/1991 | Shieh et al. | 437/129 |
| 4,990,990 A | 2/1991 | Albrecht et al. | 357/30 |
| 5,005,057 A | 4/1991 | Izumiya et al. | 357/17 |
| 5,006,908 A | 4/1991 | Matsuoka et al. | 357/17 |
| 5,008,735 A | 4/1991 | Edmond et al. | 357/74 |
| 5,008,789 A | 4/1991 | Arai et al. | 362/255 |
| 5,019,746 A | 5/1991 | Merg | 313/512 |
| 5,023,686 A | 6/1991 | Helmut et al. | 357/30 |
| 5,027,168 A | 6/1991 | Edmond | 357/17 |
| 5,034,956 A | 7/1991 | Gessner et al. | 372/45 |
| 5,041,334 A | 8/1991 | Nakajima et al. | 428/407 |
| 5,042,043 A | 8/1991 | Hatano et al. | 372/45 |
| 5,045,896 A | 9/1991 | Ash et al. | 357/17 |
| 5,049,779 A | 9/1991 | Itsuki et al. | 313/486 |
| 5,061,972 A | 10/1991 | Edmond | 357/13 |
| 5,065,207 A | 11/1991 | Heinen | 357/30 |
| 5,077,145 A | 12/1991 | Shinomiya et al. | 428/691 |
| 5,093,576 A | 3/1992 | Edmond et al. | 250/370.01 |
| 5,119,540 A | 6/1992 | Kong et al. | 29/25.01 |
| 5,120,619 A | 6/1992 | Nakajima et al. | 428/690 |
| 5,122,845 A | 6/1992 | Manabe et al. | 357/17 |
| 5,128,955 A | 7/1992 | Danielmeyer | 372/94 |
| 5,146,465 A | 9/1992 | Khan et al. | 372/45 |
| 5,155,062 A | 10/1992 | Coleman | 437/100 |
| 5,171,370 A | 12/1992 | Reithmaier et al. | 118/726 |
| 5,182,670 A | 1/1993 | Khan et al. | 359/359 |
| 5,184,247 A | 2/1993 | Schimpe | 359/344 |
| 5,185,207 A | 2/1993 | Furuoka et al. | 428/404 |
| 5,200,022 A | 4/1993 | Kong et al. | 156/612 |
| 5,202,777 A | 4/1993 | Sluzky et al. | 359/50 |
| 5,205,905 A | 4/1993 | Kotaki et al. | 156/662 |
| 5,208,878 A | 5/1993 | Thulke | 385/14 |
| 5,210,051 A | 5/1993 | Carter, Jr. | 437/107 |
| 5,218,216 A | 6/1993 | Manabe et al. | 257/103 |
| 5,229,626 A | 7/1993 | Ebitani et al. | 257/84 |
| 5,233,204 A | 8/1993 | Fletcher et al. | 257/13 |
| 5,239,188 A | 8/1993 | Takeuchi et al. | 257/76 |
| 5,247,533 A | 9/1993 | Okazaki et al. | 372/45 |
| 5,250,366 A | 10/1993 | Nakajima et al. | 428/690 |
| 5,252,499 A | 10/1993 | Rothschild | 437/22 |
| 5,252,839 A | 10/1993 | Fouquet | 257/13 |
| 5,260,960 A | 11/1993 | Amann et al. | 372/46 |
| 5,264,713 A | 11/1993 | Palmour | 257/77 |
| 5,266,503 A | 11/1993 | Wang et al. | 437/24 |
| 5,270,554 A | 12/1993 | Palmour | 257/77 |
| 5,272,108 A | 12/1993 | Kozawa | 437/127 |
| 5,278,433 A | 1/1994 | Manabe et al. | 257/103 |
| 5,281,830 A | 1/1994 | Kotaki et al. | 257/86 |
| 5,290,393 A | 3/1994 | Nakamura | 156/613 |
| 5,306,662 A | 4/1994 | Nakamura et al. | 437/107 |
| 5,312,560 A | 5/1994 | Somatomo et al. | 252/301.4 S |
| 5,323,022 A | 6/1994 | Glass et al. | 257/77 |
| 5,330,791 A | 7/1994 | Aihara et al. | 427/215 |
| 5,334,277 A | 8/1994 | Nakamura | 117/102 |
| 5,336,080 A | 8/1994 | Sumitomo et al. | 428/407 |
| 5,338,944 A | 8/1994 | Edmond et al. | 257/76 |
| 5,341,390 A | 8/1994 | Yamada et al. | 372/45 |
| 5,343,316 A | 8/1994 | Morimoto et al. | 359/50 |
| 5,344,791 A | 9/1994 | Huang | 437/126 |
| 5,359,345 A | 10/1994 | Hunter | 345/102 |
| 5,363,390 A | 11/1994 | Yang et al. | 372/22 |
| 5,363,393 A | 11/1994 | Uomi et al. | |
| 5,366,834 A | 11/1994 | Yoneda et al. | 430/23 |
| 5,369,289 A | 11/1994 | Tamaki et al. | 257/99 |
| 5,376,303 A | 12/1994 | Royce et al. | 252/301.4 R |
| 5,376,580 A | 12/1994 | Kish et al. | 437/127 |
| 5,381,103 A | 1/1995 | Edmond et al. | 324/753 |
| 5,382,822 A | 1/1995 | Stein | 257/410 |
| 5,389,571 A | 2/1995 | Takeuchi et al. | 437/133 |
| 5,390,210 A | 2/1995 | Fouquet et al. | 372/92 |
| 5,393,993 A | 2/1995 | Edmond et al. | 257/77 |
| 5,394,005 A | 2/1995 | Brown et al. | 257/461 |
| 5,403,774 A | 4/1995 | Shieh et al. | 437/129 |

(56) References Cited

U.S. PATENT DOCUMENTS

| | | | |
|---|---|---|---|
| 5,404,282 A | 4/1995 | Klinke et al. | 362/249 |
| 5,408,120 A | 4/1995 | Manabe et al. | 257/431 |
| 5,409,859 A | 4/1995 | Glass et al. | 437/187 |
| 5,416,342 A | 5/1995 | Edmond et al. | 257/76 |
| 5,417,886 A | 5/1995 | Tateiwa et al. | 252/301.4 R |
| 5,433,169 A | 7/1995 | Nakamura | 117/102 |
| 5,433,533 A | 7/1995 | Imazaike | 384/488 |
| 5,433,888 A | 7/1995 | Okada et al. | 252/301.4 R |
| 5,435,938 A | 7/1995 | Bando et al. | 252/301.4 S |
| 5,438,198 A | 8/1995 | Ebitani et al. | 250/330 |
| 5,459,107 A | 10/1995 | Palmour | 437/238 |
| 5,465,249 A | 11/1995 | Cooper, Jr. et al. | 365/149 |
| 5,467,291 A | 11/1995 | Fan et al. | 364/578 |
| 5,468,678 A | 11/1995 | Nakamura et al. | 437/107 |
| 5,475,241 A | 12/1995 | Harrah et al. | 257/99 |
| 5,492,080 A | 2/1996 | Ohkawa et al. | |
| 5,497,012 A | 3/1996 | Moll | 257/183 |
| 5,502,316 A | 3/1996 | Kish et al. | 257/94 |
| 5,506,421 A | 4/1996 | Palmour | 257/77 |
| 5,511,084 A | 4/1996 | Amann | 372/20 |
| 5,514,627 A | 5/1996 | Lowery et al. | 437/209 |
| 5,523,018 A | 6/1996 | Okada et al. | 252/301.4 P |
| 5,523,589 A | 6/1996 | Edmond et al. | 257/77 |
| 5,539,217 A | 7/1996 | Edmond et al. | 257/77 |
| 5,563,422 A | 10/1996 | Nakamura et al. | 257/13 |
| 5,578,839 A | 11/1996 | Nakamura et al. | 257/96 |
| 5,583,879 A | 12/1996 | Yamazaki et al. | 372/45 |
| 5,585,648 A | 12/1996 | Tischler | 257/77 |
| 5,587,593 A | 12/1996 | Koide et al. | 257/94 |
| 5,592,501 A | 1/1997 | Edmond et al. | 372/45 |
| 5,592,578 A | 1/1997 | Ruh | 385/31 |
| 5,596,595 A | 1/1997 | Tan et al. | 372/96 |
| 5,604,135 A | 2/1997 | Edmond et al. | 437/22 |
| 5,604,763 A | 2/1997 | Kato et al. | 372/45 |
| 5,612,260 A | 3/1997 | Palmour | 437/238 |
| 5,614,736 A | 3/1997 | Neumann et al. | 257/102 |
| 5,616,177 A | 4/1997 | Yamada | 117/102 |
| 5,620,557 A | 4/1997 | Manabe et al. | 438/507 |
| 5,621,749 A | 4/1997 | Baney | 372/69 |
| 5,625,202 A | 4/1997 | Chai | 257/94 |
| 5,627,244 A | 5/1997 | Sato | 526/92 |
| 5,629,531 A | 5/1997 | Palmour | 257/77 |
| 5,631,190 A | 5/1997 | Negley | 438/33 |
| 5,635,146 A | 6/1997 | Singh et al. | 423/65 |
| 5,642,375 A | 6/1997 | King et al. | 372/97 |
| 5,646,953 A | 7/1997 | Naito et al. | |
| 5,650,641 A | 7/1997 | Sassa et al. | 257/88 |
| 5,652,434 A | 7/1997 | Nakamura et al. | 257/13 |
| 5,652,438 A | 7/1997 | Sassa et al. | 257/94 |
| 5,656,832 A | 8/1997 | Ohba et al. | 257/190 |
| 5,659,568 A | 8/1997 | Wang et al. | 372/96 |
| 5,661,074 A | 8/1997 | Tischler | 438/32 |
| 5,661,316 A | 8/1997 | Kish, Jr. et al. | 257/190 |
| 5,661,742 A | 8/1997 | Huang et al. | 372/46 |
| 5,670,798 A | 9/1997 | Schetzina | 257/96 |
| 5,679,153 A | 10/1997 | Dmitriev et al. | 117/106 |
| 5,684,623 A | 11/1997 | King et al. | 359/346 |
| 5,686,737 A | 11/1997 | Allen | 257/77 |
| 5,693,963 A | 12/1997 | Fujimoto et al. | |
| 5,700,713 A | 12/1997 | Yamazaki et al. | 437/129 |
| 5,707,139 A | 1/1998 | Haitz | 362/231 |
| 5,718,760 A | 2/1998 | Carter et al. | 117/84 |
| 5,719,409 A | 2/1998 | Singh et al. | 257/77 |
| 5,724,062 A | 3/1998 | Hunter | 345/102 |
| 5,724,373 A | 3/1998 | Chang | 372/20 |
| 5,724,376 A | 3/1998 | Kish, Jr. et al. | 372/96 |
| 5,727,014 A | 3/1998 | Wang et al. | 372/96 |
| 5,729,029 A | 3/1998 | Rudaz | 257/13 |
| 5,729,567 A | 3/1998 | Nakagawa | 372/99 |
| 5,733,796 A | 3/1998 | Manabe et al. | 437/127 |
| 5,734,182 A | 3/1998 | Nakamura et al. | 257/96 |
| 5,739,552 A | 4/1998 | Kimura et al. | 257/89 |
| 5,739,554 A | 4/1998 | Edmond et al. | 257/103 |
| 5,741,431 A | 4/1998 | Shih | 216/65 |
| 5,741,724 A | 4/1998 | Ramdani et al. | 437/128 |
| 5,742,133 A | 4/1998 | Wilhelm et al. | 315/291 |
| 5,747,827 A | 5/1998 | Duggan et al. | |
| 5,747,832 A | 5/1998 | Nakamura et al. | 257/103 |
| 5,753,939 A | 5/1998 | Sassa et al. | 257/94 |
| 5,758,951 A | 6/1998 | Haitz | 362/259 |
| 5,761,229 A | 6/1998 | Baldwin et al. | 372/31 |
| 5,767,581 A | 6/1998 | Nakamura et al. | 257/749 |
| 5,771,254 A | 6/1998 | Baldwin et al. | 372/31 |
| 5,776,792 A | 7/1998 | Naito et al. | |
| 5,776,837 A | 7/1998 | Palmour | 438/767 |
| 5,777,350 A | 7/1998 | Nakamura et al. | 257/96 |
| 5,777,433 A | 7/1998 | Lester et al. | 313/512 |
| 5,779,924 A | 7/1998 | Krames et al. | 216/24 |
| 5,780,120 A | 7/1998 | Belouet et al. | 427/554 |
| 5,785,404 A | 7/1998 | Wiese | 362/32 |
| 5,787,104 A | 7/1998 | Kamiyama et al. | |
| 5,789,265 A | 8/1998 | Nitta et al. | |
| 5,793,054 A | 8/1998 | Nido | 257/18 |
| 5,793,062 A | 8/1998 | Kish, Jr. et al. | 257/98 |
| 5,804,834 A | 9/1998 | Shimoyama et al. | |
| 5,805,624 A | 9/1998 | Yang et al. | 372/45 |
| 5,808,323 A | 9/1998 | Spaeth et al. | 257/88 |
| 5,808,592 A | 9/1998 | Mizutani et al. | 345/83 |
| 5,809,050 A | 9/1998 | Baldwin et al. | 372/43 |
| 5,811,319 A | 9/1998 | Koike et al. | 438/46 |
| 5,811,931 A | 9/1998 | Mueller-Mach et al. | 313/512 |
| 5,812,105 A | 9/1998 | Van De Ven | 345/83 |
| 5,812,570 A | 9/1998 | Spaeth | 372/36 |
| 5,814,870 A | 9/1998 | Spaeth | 257/433 |
| 5,815,520 A | 9/1998 | Furushima | |
| 5,818,861 A | 10/1998 | Tan et al. | 372/46 |
| 5,828,684 A | 10/1998 | Van De Walle | 372/45 |
| 5,831,288 A | 11/1998 | Singh et al. | 257/77 |
| 5,835,514 A | 11/1998 | Yuen et al. | 372/36 |
| 5,835,522 A | 11/1998 | King et al. | 372/97 |
| 5,837,561 A | 11/1998 | Kish, Jr. et al. | 438/47 |
| 5,838,029 A | 11/1998 | Shakuda | |
| 5,838,706 A | 11/1998 | Edmond et al. | 372/45 |
| 5,838,707 A | 11/1998 | Ramdani et al. | 372/45 |
| 5,838,708 A | 11/1998 | Lin et al. | 372/50 |
| 5,846,844 A | 12/1998 | Akasaki et al. | 437/21 |
| 5,847,507 A | 12/1998 | Butterworth et al. | 313/512 |
| 5,850,410 A | 12/1998 | Kuramata | 372/43 |
| 5,855,924 A | 1/1999 | Lumbard | 425/116 |
| 5,858,277 A | 1/1999 | Chau et al. | 252/301.4 F |
| 5,859,496 A | 1/1999 | Murazaki et al. | 313/485 |
| 5,861,190 A | 1/1999 | Greene et al. | 427/248.1 |
| 5,861,713 A | 1/1999 | Kondo et al. | 313/495 |
| 5,862,167 A | 1/1999 | Sassa et al. | 372/45 |
| 5,867,516 A | 2/1999 | Corzine et al. | 372/45 |
| 5,868,837 A | 2/1999 | Disalvo et al. | 117/952 |
| 5,877,558 A | 3/1999 | Nakamura et al. | 257/749 |
| 5,879,587 A | 3/1999 | Yale | 252/301.45 |
| 5,879,588 A | 3/1999 | Yale | 252/301.45 |
| 5,880,486 A | 3/1999 | Nakamura et al. | 257/96 |
| 5,889,802 A | 3/1999 | Walker | 372/31 |
| 5,889,806 A | 3/1999 | Nagai et al. | 372/45 |
| 5,892,784 A | 4/1999 | Tan et al. | 372/43 |
| 5,892,787 A | 4/1999 | Tan et al. | 372/96 |
| 5,900,650 A | 5/1999 | Nitta | 257/94 |
| 5,903,017 A | 5/1999 | Itaya et al. | |
| 5,905,276 A | 5/1999 | Manabe et al. | 257/103 |
| 5,907,151 A | 5/1999 | Gramann et al. | 250/214.1 |
| 5,909,040 A | 6/1999 | Ohba et al. | |
| 5,912,477 A | 6/1999 | Negley | 257/95 |
| 5,917,202 A | 6/1999 | Haitz et al. | 257/98 |
| 5,919,422 A | 7/1999 | Yamanaka et al. | 422/121 |
| 5,920,766 A | 7/1999 | Floyd | 438/35 |
| 5,923,053 A | 7/1999 | Jakowetz et al. | 257/95 |
| 5,923,118 A | 7/1999 | Jennato et al. | 313/485 |
| 5,923,690 A | 7/1999 | Kume et al. | 372/46 |
| 5,923,946 A | 7/1999 | Negley | 438/4 |
| 5,925,898 A | 7/1999 | Spath | 257/98 |
| 5,927,995 A | 7/1999 | Chen et al. | 438/517 |
| 5,929,466 A | 7/1999 | Ohba et al. | |
| 5,932,896 A | 8/1999 | Sugiura et al. | |
| 5,935,705 A | 8/1999 | Chen et al. | 428/367 |
| 5,936,985 A | 8/1999 | Yamamoto et al. | 372/38 |
| 5,945,689 A | 8/1999 | Koike et al. | 257/88 |

(56) References Cited

U.S. PATENT DOCUMENTS

| | | | |
|---|---|---|---|
| 5,953,361 A | 9/1999 | Borchert et al. | 372/96 |
| 5,953,581 A | 9/1999 | Yamasaki et al. | 438/22 |
| 5,958,295 A | 9/1999 | Yale | 252/301.4 S |
| 5,959,307 A | 9/1999 | Nakamura et al. | |
| 5,959,316 A | 9/1999 | Lowery | 257/98 |
| 5,959,401 A | 9/1999 | Asami et al. | 313/503 |
| 5,964,943 A | 10/1999 | Stein et al. | 117/88 |
| 5,966,393 A | 10/1999 | Hide et al. | 372/23 |
| 5,968,265 A | 10/1999 | Stein et al. | 117/71 |
| 5,969,378 A | 10/1999 | Singh | 257/77 |
| 5,972,781 A | 10/1999 | Wegleiter et al. | 438/460 |
| 5,972,801 A | 10/1999 | Lipkin et al. | 438/770 |
| 5,973,336 A | 10/1999 | Hanke et al. | 257/94 |
| 5,980,631 A | 11/1999 | Tews et al. | 117/89 |
| 5,981,945 A | 11/1999 | Spaeth et al. | 250/239 |
| 5,981,979 A | 11/1999 | Brunner | 257/99 |
| 5,982,970 A | 11/1999 | Schneider | 385/125 |
| 5,986,317 A | 11/1999 | Wiese | 257/433 |
| 5,991,160 A | 11/1999 | Lumbard | 361/760 |
| 5,994,722 A | 11/1999 | Averbeck et al. | 257/89 |
| 5,998,925 A | 12/1999 | Shimizu et al. | 313/503 |
| 5,999,552 A | 12/1999 | Bogner et al. | 372/43 |
| 6,023,077 A | 2/2000 | Iyechika et al. | |
| 6,060,730 A | 5/2000 | Tsutsui | |
| 6,103,604 A | 8/2000 | Bruno et al. | |
| 6,172,382 B1 | 1/2001 | Nagahama et al. | |
| 6,204,084 B1 | 3/2001 | Sugiura et al. | |
| 6,320,207 B1 | 11/2001 | Furukawa et al. | |
| 6,326,638 B1 | 12/2001 | Kamiyama et al. | |
| 6,346,720 B1 | 2/2002 | Iyechika et al. | |
| 6,377,596 B1 | 4/2002 | Tanaka et al. | |
| 6,472,298 B2 | 10/2002 | Iyechika et al. | |
| 7,365,369 B2 | 4/2008 | Nakamura et al. | |
| 2003/0010993 A1 | 1/2003 | Nakamura et al. | |

FOREIGN PATENT DOCUMENTS

| | | |
|---|---|---|
| DE | 196 48 955 | 5/1997 |
| DE | 198 30 838 A1 | 1/1999 |
| EP | 0356059 A2 | 2/1990 |
| EP | 0356059 A3 | 2/1990 |
| EP | 0380340 A2 | 8/1990 |
| EP | 0380340 A3 | 8/1990 |
| EP | 0 449 769 A1 | 10/1991 |
| EP | 0637069 A1 | 2/1995 |
| EP | 0 678 945 A1 | 10/1995 |
| EP | 0731512 | 9/1996 |
| EP | 0731512 A2 | 9/1996 |
| EP | 0731512 A3 | 7/1997 |
| EP | 0781619 A1 | 7/1997 |
| EP | 0871208 A2 | 10/1998 |
| EP | 0880181 A2 | 11/1998 |
| EP | 0871208 A3 | 12/1998 |
| EP | 0880181 A3 | 1/1999 |
| EP | 0905799 A2 | 3/1999 |
| EP | 0936682 A1 | 8/1999 |
| EP | 1 017 113 A1 | 7/2000 |
| FR | 2613136 | 9/1988 |
| GB | 2 317 053 | 3/1998 |
| GB | 2322737 A | 3/1998 |
| GB | 2323210 A | 9/1998 |
| JP | 61221726 | 10/1986 |
| JP | 1-308082 | 12/1989 |
| JP | 2-288371 | 11/1990 |
| JP | 3-203388 | 9/1991 |
| JP | 03-252175 | 11/1991 |
| JP | 3-257887 | 11/1991 |
| JP | 4-122070 | 4/1992 |
| JP | 4122070 | 4/1992 |
| JP | 04144294 | 5/1992 |
| JP | 04-163969 | 6/1992 |
| JP | 4-316600 | 11/1992 |
| JP | 5-110138 | 4/1993 |
| JP | 5-110139 | 4/1993 |
| JP | 05152609 | 6/1993 |
| JP | 5-183189 | 7/1993 |
| JP | 5-283791 | 10/1993 |
| JP | 6-021511 | 1/1994 |
| JP | 6-151963 | 5/1994 |
| JP | 06-151965 | 5/1994 |
| JP | 6-152072 | 5/1994 |
| JP | 06-177059 | 6/1994 |
| JP | 06-196755 | 7/1994 |
| JP | 06-209122 | 7/1994 |
| JP | 6-232451 | 8/1994 |
| JP | 6-268257 | 9/1994 |
| JP | 06-275868 | 9/1994 |
| JP | 07-015041 | 1/1995 |
| JP | 0766192 | 3/1995 |
| JP | 7-162038 | 6/1995 |
| JP | 7-169701 | 7/1995 |
| JP | 7176794 | 7/1995 |
| JP | 7-202346 | 8/1995 |
| JP | 7-249795 | 9/1995 |
| JP | 7-273048 | 10/1995 |
| JP | 7-297494 | 11/1995 |
| JP | 7-302929 | 11/1995 |
| JP | 08-008247 | * 1/1996 |
| JP | 08-008247 A | 1/1996 |
| JP | 08-008274 | * 1/1996 |
| JP | 08-023124 | 1/1996 |
| JP | 08-056015 | 2/1996 |
| JP | 08-070139 | 3/1996 |
| JP | 8-083954 | 3/1996 |
| JP | 08-116090 | 5/1996 |
| JP | 08-130327 | 5/1996 |
| JP | 08-148718 | 6/1996 |
| JP | 8-181378 | 7/1996 |
| JP | 8-191171 | 7/1996 |
| JP | 1064854 | 7/1996 |
| JP | 8-203834 | 8/1996 |
| JP | 8-213651 | 8/1996 |
| JP | 8-228048 | 9/1996 |
| JP | 8-250810 | 9/1996 |
| JP | 8-255932 | 10/1996 |
| JP | 8-264833 | 10/1996 |
| JP | 8-8274 | 12/1996 |
| JP | 8-330630 | 12/1996 |
| JP | 9-18053 | 1/1997 |
| JP | 9-27640 | 1/1997 |
| JP | 9-45960 | 2/1997 |
| JP | 10233529 | 2/1997 |
| JP | 9-92880 | 4/1997 |
| JP | 9-97921 | 4/1997 |
| JP | 9-116130 | 5/1997 |
| JP | 9-116234 | 5/1997 |
| JP | 9-129920 | 5/1997 |
| JP | 9-129930 | 5/1997 |
| JP | 9-148247 | 6/1997 |
| JP | 9-148678 | 6/1997 |
| JP | 09180998 | 7/1997 |
| JP | 09193137 | 7/1997 |
| JP | 9-36426 | 9/1997 |
| JP | 9-232629 | 9/1997 |
| JP | 09246651 | 9/1997 |
| JP | 09260772 | 10/1997 |
| JP | 09-293897 | 11/1997 |
| JP | 9-293935 | 11/1997 |
| JP | 9-298341 | 11/1997 |
| JP | 09293935 | 11/1997 |
| JP | 09-321338 | 12/1997 |
| JP | 10-004210 | 1/1998 |
| JP | 10-41549 | 2/1998 |
| JP | 10-084132 | 3/1998 |
| JP | 10-093137 | 4/1998 |
| JP | 10-093194 | 4/1998 |
| JP | 10-135575 | 5/1998 |
| JP | 10-145004 | 5/1998 |
| JP | 10-163523 | 6/1998 |
| JP | 10242565 | 9/1998 |
| JP | 10256645 | 9/1998 |
| JP | 10270792 | 10/1998 |
| JP | 10290027 | 10/1998 |

(56) References Cited

FOREIGN PATENT DOCUMENTS

| | | |
|---|---|---|
| JP | 10-303458 | 11/1998 |
| JP | 10294529 | 11/1998 |
| JP | 10-335757 | 12/1998 |
| JP | 10321962 | 12/1998 |
| JP | 11-031842 | 2/1999 |
| JP | 11-31866 | 2/1999 |
| JP | 11040893 | 2/1999 |
| JP | 11-177175 | 7/1999 |
| JP | 11-195812 | 7/1999 |
| JP | 11-214746 | 8/1999 |
| JP | 2000-31599 | 1/2000 |
| JP | 2003-101154 | 4/2003 |
| WO | WO 96/30945 | 10/1996 |
| WO | WO9702478 A1 | 1/1997 |
| WO | WO9702610 A1 | 1/1997 |
| WO | WO 97/11518 | 3/1997 |
| WO | WO9717730 A1 | 5/1997 |
| WO | WO9727629 A1 | 7/1997 |
| WO | WO9739485 A1 | 10/1997 |
| WO | WO9750132 A1 | 12/1997 |
| WO | WO9805078 A1 | 2/1998 |
| WO | WO9812757 A1 | 3/1998 |
| WO | WO 98/31055 | 7/1998 |
| WO | WO9834304 A1 | 8/1998 |
| WO | WO9837586 A1 | 8/1998 |
| WO | WO9842879 A1 | 10/1998 |
| WO | WO9842897 A1 | 10/1998 |
| WO | WO9847185 A1 | 10/1998 |
| WO | WO9849731 A1 | 11/1998 |
| WO | WO9857378 A1 | 12/1998 |
| WO | WO 99/05728 | 2/1999 |
| WO | WO9910936 A2 | 3/1999 |
| WO | WO9910936 A3 | 3/1999 |
| WO | WO9918617 A1 | 4/1999 |

OTHER PUBLICATIONS

Translation of JP 08-008274.*
Suemune, "Doping in a superlattice structure: Improved hole activation in wide-gap II-VI materials," J. Appl. Phys., vol. 67, No. 5 (1990), pp. 2364-2369.
Nakamura et al., "Ridge-geometry InGaN multi-quantum-well-structure laser diodes," Appl. Phys. Lett., vol. 69, No. 10 (1996), pp. 1477-1479.
Detchprohm et al., "Hydride vapor phase epitaxial growth of a high quality GaN film using a ZnO buffer layer," Appl. Phys. Lett., vol. 61, No. 22 (1992), pp. 2688-2690.
Nakamura et al., "InGaN-Based Multi-Quantum-Well-Structure Laser Diodes," Jpn. J. Appl. Phys. Lett., vol. 35, Part 2 [1B] (1996), pp. L74-76.
Nakamura et al., "Present Status of InGaN/GaN/AlGaN-Based Laser Diodes," Proceedings of the Second International Conference on Nitride Semiconductors (INCS '97), 1997, pp. 444-446.
Shibata et al., "Hybride Vapor Phase Epitaxy Growth of High Quality GaN Bulk Single Crystal by Epitaxial Lateral Overgrowth," Proceedings of the Second International Conference on Nitride Semiconductors (INCS '97), Oct. 27-31, 1997, pp. 154-155.
Matsushima et al., "Sub-micron Fine Structure of GaN by MOVPE Selective Area Growth (SAG) and Buried Structure by Epitaxial Lateral Overgrowth (ELO)," Proceedings of the Second International Conference on Nitride Semiconductors (INCS '97), 1997, pp. 492-493.
Nakamura et al., "InGaN-Based Multi-Quantum-Well-Structure Laser Diodes," Jpn. J. Appl. Phys., vol. 35, Part 2, No. 1B (Jan. 15, 1996), pp. L74-L76.
Nakamura et al., "InGaN-Based Multi-Quantum-Well-Structure Laser Diodes With Cleaved Mirror Cavity Facets," Jpn. J. Appl. Phys., vol. 35, Part 2, No. 2B (Feb. 15, 1996), pp. L217-L220.
Nakamura et al., "High-Power, Long-Lifetime InGaN Multi-Quantum-Well-Structure Laser Diodes," Jpn. J. Appl. Phys., vol. 36, Part 2, No. 8B (Aug. 15, 1997), pp. L1059-L1061.
Degertekin et al., "Single Mode Lamb Wave Excitation in Thin Plates by Hertzian Contacts" Appl. Phys. Lett. 69(2) (Jul. 8, 1996), pp. 146-148.
Shao et al., "Radio-frequency-magnetron-sputtered CdS/CdTe solar cells on soda-lime glass," Appl. Phys. Lett. 69 (20) (Nov. 11, 1996), pp. 3045-3047.
Nakamura et al., "Room-temperature continuous-wave operation of InGaN multi-quantum-well structure laser diodes," Appl. Phys. Lett. 69(26) (Dec. 23, 2996), pp. 4056-4058.
Preliminary Notice of Rejection of Japanese Appln. No. 10-199829 (Feb. 15, 2005) (including translation).
Suemune, Ikuo, "Doping in a superlattice structure: Improved hole activation in wide-gap II-VI materials," Journal of Applied Physics, U.S.A. American Institute of Physics (Mar. 1, 1990), vol. 67, No. 5, pp. 2364-2369.
Nishio et al Characterization of InGaN multiquantum well structures for blue semiconductor laser diodes Appl. Phys. Lett., vol. 70, No. 25, pp. 3431-3433 Jun. 23, 1997.
Akasaki et al Shortest wavelength semiconductor laser diode, Electronics Letters vol. 32, No. 12, pp. 1105-1106,Jun. 6, 1996.
Akasaki et al Stimulated Emission by Current Injection from an AlGaN/GaN/GaInN Quantum Well Device, Jpn. J. Appl. Phys. vol. 34, pp. L1517-L1519, 1995.
Sakai et al GaN/GaIN Double Heterostructure Light Emitting Diode Fabricated Using Plasma-Assisted Molecular Beam Epitaxy, Jpn. J. Appl. Phys., vol. 34, pp. L1429-1431, 1995.
Inamori et al Direct Patterning of the Current Confinement Structure for p-Type Column-III Nitrides by Low-Energy Electron Beam Irradiation Treatment, Jpn. J. Appl. Phys. vol. 34, pp. 1190-1193, 1995.
Itaya et al Room Temperature Pulsed Operation of Nitride Based Multi-Quantum-Well Laser Diodes with Cleaved Facets on Conventional C-Face Sapphire Substrates,Jpn. J. Appl. Phys., vol. 35, pp. L1315-L1317, 1996.
Nakamura J. Selected Topics in Quantum Electronics, vol. 3, No. 2, pp. 435-442 Apr. 1997 GaN-Based Blue/Green Semiconductor Laser.
Nakamura et al., "InGaN/GaN/AlGaN-based laser diodes with modulation-doped strained-layer superlattices grown on an expitaxially laterally overgrown GaN substrate," Appl. Physics Letter, vol. 72, No. 2 (Jan. 12, 1998).
"Novel Metalorganic Chemical Vapor Deposition System for GaN Growth," S. Nakamura, American Institute of Physics, pp. 2021-2023, May 6, 1991.
"Out of the Blue," Forbes Global Magazine, pp. 66-71, Sep. 6, 1999.
"Nitride PN Junctions Grown on SiC Substrates," V.A. Dmitriev, Inst. Phys. Conf., pp. 1019-1022, 1996.
"AlGaN PN Junctions," V.A. Dmitriev, American Inst. of Physics, pp. 115-117, May 11, 1995.
"Effects of Ar Ion Laser Irradiation on MOVPE of ZnSe using DMZn and DMSe as Reactants," A. Yoshikawa,Journal of Crystal Growth, pp. 653-658, 1991.
"Electric Breakdown in GaN P-N Junctions," V.A. Dmitriev, American Inst. of Physics, pp. 229-231, Jan. 8, 1996.
"High Quality GaN Grown Directly on SiC by Halide Vapour Phase Epitaxy," Y.V. Melnik, Inst. Phys. Conf., pp. 863-866, 1996.
"Luminescence Conversion of Blue Light Emitting Diodes," P. Schlotter, Journal of Applied Physics, pp. 12-13, Feb. 27, 1997.
"P-Type Conduction in Mg-Doped GaN Treated with Low-Energy Electron Beam Irradiation (LEEBI)," H. Amano, Japanese Journal of Applied Physics, pp. 2112-2114, Dec. 1989.
"Photoluminescence of Mg-Doped P-Type GaN and Electroluminescence of GaN P-N Junction Led," I. Akasaki, Journal of Luminescence vol. 48-49, pp. 666-670, 1991.
"Recent Progress in AlGaN/GaN Laser Structures on 6H-SiC," G.E. Bulman, SPIE vol. 2693, pp. 57-63, 1996.
"Recent Progress in GaN/SiC LEDs and Photopumped Lasers," G.E. Bulman, pp. 100-101, 19xx.
"Role of Growth Initiation for High-Brightness GaN-Based Light Emitting Diodes," R.S. Kern, 2nd. Intern. Symp. on Blue Laser and Light Emitting Diodes, Chiba, Japan, Sep. 29-Oct. 2, 1998.
"The State of SiC: GaN-Based Blue LEDs," J. Edmond, Inst. Phys. Conf. Ser. No. 142, Chap. 6, pp. 991-994, 1996.

(56) References Cited

OTHER PUBLICATIONS

"Wide Bandgap Group-III Nitride Optoelectronics," http://www.phy.duke.edu/research/photon/terahertz/garn/index.html.

"White LED Production at Osram," G. Bogner, Compound Semiconductor, pp. 28-31, May 1999.

Official Action issued in Japanese Patent Appln. No. 10-227609 (Apr. 28, 2009) (w/full English machine translation).

Official Action issued in Japanese Patent Appln. No. 10-227609 (Feb. 9, 2010) (w/full English machine translation).

Nakamura et al., "Superbright Green InGaN Single-Quantum-Well-Structure Light-Emitting Diodes," J.J.A.P. vol. 34, No. 10B (1995), pp. L1332-L1335.

Official Action issued in Japanese Patent Appln. No. 2001-319394 (Nov. 11, 2008) (w/full English translation).

Office Action issued in U.S. Appl. No. 09/463,643, filed Sep. 19, 2001.

Office Action issued in U.S. Appl. No. 09/463,643, filed Jun. 5, 2002.

Office Action issued in U.S. Appl. No. 09/463,643, filed Dec. 13, 2002.

Office Action issued in U.S. Appl. No. 09/463,643, filed Jul. 15, 2003.

Office Action issued in U.S. Appl. No. 09/463,643, filed Feb. 10, 2004.

Office Action issued in U.S. Appl. No. 09/463,643, filed Oct. 18, 2004.

Ng, "Complete Guide to Semiconductor Devices," 1995, McGraw-Hill, pp. 582-584.

Office Action issued in U.S. Appl. No. 09/463,643, filed Mar. 30, 2005.

Office Action issued in U.S. Appl. No. 09/463,643, filed Jun. 8, 2006.

Office Action issued in U.S. Appl. No. 09/463,643, filed Jan. 19, 2007.

Notification and Submission of the printed publication of corresponding Japanese Application No. 2001-319394 (with partial English translations) which contains the above reference therein (Aug. 10, 2010).

G.E. Bulman, "Recent Progress in GaN/SiC LEDs and Photopumped Lasers", pp. 100-101, Lasers and Electro-Optics Society Annual Meeting, 8th Annual Meeting Conference Proceedings, vol. 1, IEEE (vol. 2) Oct. 30 and Nov. 2 1995.

"Wide Bandgap Group-III Nitride Optoelectronics", http://www.phy.duke.edu/research/photon/terahertz/han/index.html, 3 pages, Jul. 16, 1999.

US 5,961,723, 10/1999, Roithner et al. (withdrawn)

\* cited by examiner

NITRIDE SEMICONDUCTOR DEVICE

CROSS-REFERENCES TO RELATED APPLICATIONS

This application is a divisional of U.S. application Ser. No. 09/463,643, filed May 1, 2000, which is the US national phase of international application PCT/JP98/03336 filed Jul. 27, 1998, which designated the U.S. PCT/JP98/03336 claims priority to JP Application Nos. 9-199471, filed Jul. 25, 1997; 9-235524, filed Sep. 1, 1997; 9-286304, filed Oct. 20, 1997; 9-304328, filed Nov. 6, 1997; 9-317421, filed Nov. 18, 1997; 9-348972, filed Dec. 18, 1997; 9-348973, filed Dec. 18, 1997; 10-176623, filed Jun. 8, 1998; 10-176634, filed Jun. 8, 1998; and 10-199829, filed Jun. 29, 1998, the entire contents of these applications are incorporated herein by reference

TECHNICAL FIELD OF THE INVENTION

This invention relates to a device provided with a nitride semiconductor ($In_XAl_YGa_{1-X-Y}N$, $0 \leq X$, $0 \leq Y$, $X+Y \leq 1$) including light emitting devices such as LED (light emitting diode) and LD (laser diode), solar cells, light receiving devices such as optical sensors and electronic devices such as transistors and power devices.

BACKGROUND OF THE INVENTION

Nitride semiconductors have been recently produced as materials used for a high bright pure green LED and a blue LED in various light sources for a full color LED display, a traffic signal and an image scanner and the like. These LEDs basically have such a stricture that a buffer layer, a n-side contact layer made of Si-doped GaN, an active layer of SQW (Single Quantum Well) made of InGaN or MQW (Multi Quantum Well) including InGaN, a p-side cladding layer made of Mg-doped AlGaN and a p-side contact layer made of Mg-doped GaN are laminated sequentially on the sapphire substrate. Such LEDs show excellent properties and for example, at 20 mA, for blue LED having a light emitting wavelength of 450 nm, 5 mW of output and 9.1% of an external quantum efficiency can be achieved and for green LED having a light emitting wavelength of 520 nm, 3 mW of output and 6.3% of an external quantum efficiency can be achieved.

The inventors have first realized laser emitting of 410 nm at room temperature by using the above nitride materials and reported it in Jpn. J. Appl. Phys. 35 (1996) L74 and Jpn. J. Appl. Phys. 35 (1996) L217. The laser device comprises the DH structure where the active layer is MQW having InGaN well layers and showed the following data:

Threshold current: 610 mA;
Threshold current density: 8.7 kA/m2;
Wavelength: 410 nm;
(pulse width 2 μm and pulse cycle 2 ms)

The inventors have first succeeded in CW (Continuous-Wave) Oscillation or Operation at room temperature and reported it in Gijutsu-Sokuho of Nikkei Electronics issued on Dec. 2, 1996, Appl. Phys. Lett. 69 (1996) and Appl. Phys. Lett. 69 (1996) 4056.

The laser diode showed a lifetime of 27 hours at 20° C. under the threshold current density of 3.6 kA/cm², the threshold voltage of 5.5 V and the output of 1.5 mW.

Thus, nitride semiconductors have been produced as materials for a LED. And for a LD, continuous-wave oscillation or operation of as long as a few tens hours can be achieved. However, a further enhancement of the output is required in order to use LEDs for illumination lights, outdoor displays exposed to the direct rays of the sun and the like. And it is necessary to improve LDs, in order to decrease the threshold in LDs and realize a longer lifetime of the LDs and to use the LDs in light sources such as the light-pick-up, DVD and the like. Said LD showed a forward current of 20 mA and a forward voltage (Vf) of near 3.6V. Further decrease of Vf leads to decrease of generation of heat in the device, resulting in increase of reliability. It is extremely important to decrease the threshold voltage in the laser devices to realize a longer lifetime of the devices.

In view of such circumstances, this invention has been accomplished. The main object of the present invention is to enhance the output of the nitride semiconductor devices such as LED and LD and to decrease Vf and the threshold voltage thereof, resulting in the enhancement of the reliability of the devices. Particularly, the first object of the present invention is to increase the carrier concentration in the n-type contact layer and decrease the resistivity thereof.

Further, the second object of the present invention is to provide an n-type nitride layer structure in which the carrier concentration in the n-type contact layer is increased and the crystallinity of the nitride semiconductor layer formed on the n-type contact layer can be enhanced.

DISCLOSURE OF THE INVENTION

According to the present invention, there is provided a nitride semiconductor device comprising an above-mentioned n-type contact layer in a specific three-layer laminated structure or a super lattice structure.

According to a first aspect of the present invention, there is provided a nitride semiconductor device, which is a light emitting device, comprising at least a substrate an n-type contact layer forming an n-electrode, an active layer where electrons and holes are recombined and a p-type contact layer forming a p-electrode, each layer being made of nitride semiconductor, wherein the n-type contact layer is made of a nitride semiconductor doped with an n-type impurity and has a first surface and a second surface, and undoped nitride semiconductor layers are formed close to the first and second surfaces, respectively, resulting in the three-layer laminated structure of the n-type contact layer.

In this case, an undoped nitride semiconductor layer means an intentionally not doped layer and includes a nitride semiconductor layer which may contain an impurity originally contained in the raw material, unintentionally introduced by the contamination within the reactor and by diffusion from the other layers which is intentionally doped with an impurity, and also a layer which is considered to be a substantially undoped layer because of doping in a very small amount (for example, resistivity of $3 \times 10^{-1} \Omega \cdot cm$ or more). An n-type impurity includes Group IV elements such as Si, Ge, Sn and the like and Si is preferred. The nitride semiconductor layers which are laminated therewith, including the n-type contact layer may be made of for example, GaN, InGaN and AlGaN and preferably, the n-type contact layer may be made of GaN including no In or Al in the term of the crystallinity. While the undoped nitride semiconductor layers which are formed on the both sides of the n-type contact layer will be described below in detail. In the case that the n-type contact layer is the second layer of the three-layer laminated structure, the first nitride semiconductor layer formed on the substrate side thereof may be preferably made of GaN or AlGaN and the nitride semiconductor layer formed on the opposite side of the n-type contact layer to the substrate may be preferably made of GaN, InGaN or AlGaN. Particularly, the representative of the three-layer laminated structure may include the three-layer laminated structure of undoped GaN layer (third layer)/Si-doped GaN layer (second layer)/undoped GaN layer (first layer) in which the n-type contact layer (second layer) doped with Si is sandwiched between the undoped GaN layers.

The second nitride semiconductor layer (n-type contact layer) can have a carrier concentration of not less than $3 \times 10^{10}/cm^3$ and the resistivity is less than $8 \times 10^{-3} \Omega \cdot cm$ in the term of the mobility of the layer. The resistivity of the conventional n-type contact layer has been limited to $8 \times 10^{-3} \Omega \cdot cm$ (for example, U.S. Pat. No. 5,733,796). The decrease of the resistivity can lower Vf. The resistivity of $6 \times 10^{-3} \Omega \cdot cm$ or less can be achieved and more preferably, $4 \times 10^{-3} \Omega \cdot cm$ or less. The lower limit is not specified and it is desirable to adjust to $1 \times 10^{-5} \Omega \cdot cm$ or ore. If the resistivity becomes lower than the lower limit, the amount of the impurity becomes too much and the crystallinity of the nitride semiconductor tends to decline.

Moreover, a buffer layer which is grown at a temperature lower than that for the first nitride semiconductor is preferably formed between the substrate and the first nitride semiconductor layer. The buffer layer may be made by for example, growing AlN, GaN, AlGaN and the like at the temperatures ranging from 400° C. to 900° C. to the thickness of 0.5 μm or less and acts as a underlying layer for relaxing a lattice mismatch between the substrate and the first nitride semiconductor and growing the first nitride semiconductor layer having a good crystallinity. Particularly, in the case that the first nitride semiconductor layer is made of GaN, the butter layer may be preferably made of GaN.

Further, the thickness of the third nitride semiconductor layer may preferably be 0.5 μm or less. More preferably, the thickness of the third nitride semiconductor layer may be 0.2 μm or less, most preferably 0.15 μm or less. The lower limit is not specified and it is desirable to adjust to 10 Å or more, preferably 50 Å or more and most preferably 100 Å or more. Since the third nitride semiconductor layer is an undoped layer and usually has a high resistivity of $0.1 \Omega \cdot cm$ or more, in the case that the third nitride semiconductor layer is thick, Vf tends not to decrease.

According to a second aspect of the present invention, there is provided a nitride semiconductor device, which is a light emitting device on a substrate, comprising at least an n-type contact layer forming at least an n-electrode on the substrate, an active layer where electrons and holes are recombined and a p-type contact layer forming a p-electrode, each layer being made of nitride semiconductor, wherein the n-type contact layer is a super lattice layer made by laminating at least a nitride semiconductor doped with an n-type impurity and an undoped nitride semiconductor layer doped with no n-type impurity. Also, as in the case of the first nitride semiconductor device described above, it is preferable that the first and third nitride semiconductor layers are not doped with an n-type impurity or are doped by the concentration of an n-type impurity smaller than that in the super lattice layer and are formed close to the first and second surface of the n-type contact layer, respectively in a manner that the second nitride semiconductor layer (n-type contact layer) is interposed between the first layer and the third one.

In the second nitride semiconductor device, the super lattice structure means a structure made by laminating the nitride semiconductor layers which has a thickness of 100 Å or less, more preferably 70 Å or less and most preferably 50 Å or less in the multi-layered structure. And in this specifications, the super lattice structure or layer includes a type of multi-layered film made by laminating layers which have different constitutions from each other and a type of multi-layered film made by laminating layers which have the same constitutions and different amounts of a n-type impurity from each other. Further, an undoped nitride semiconductor layer means a nitride semiconductor layer which is not intentionally doped with an impurity and has the same meaning as in the case of the above first light emitting device.

Also, in the second nitride semiconductor device, a buffer layer which is grown at a lower temperature than that for the first nitride semiconductor layer may be formed between the substrate and the first nitride semiconductor layer. The buffer layer may be made by for example, growing AlN, GaN, AlGaN and the like at the temperatures ranging from 400° C. to 900° C. to the thickness of 0.5 μm or less and acts as a underlying layer for relaxing a lattice mismatch between the substrate and the nitride semiconductor and growing the first nitride semiconductor layer having a good crystallinity.

The second nitride semiconductor layer may be made by laminating two kinds of nitride semiconductor layers which have different band gap energy from each other and may be made by laminating another nitride semiconductor between said two kinds of nitride semiconductor layers.

In this case, said two kinds of nitride semiconductor layers preferably have different concentrations of an n-type impurity doped from each other. Hereinafter, the configuration of the super lattice layer in which the nitride semiconductor layers have different concentrations of an impurity from each other is called modulation doping.

Also, in the case that the second nitride semiconductor layer is formed by laminating two kinds of layers which have different band gap energy from each other, the layer having a higher band gap energy may be doped with a n-type impurity in a larger amount or the layer having a lower band gap energy may be doped in a larger amount.

And in the case that the second nitride semiconductor layer is formed by laminating two kinds of layers which have different band gap energy from each other, one of the layers is preferably is not doped with an impurity, that is, is an undoped layer. In this case, the layer having a higher band gap energy may be doped with an n-type impurity or the layer having a lower band gap energy may be doped.

Further, in the present invention, said second nitride semiconductor layer may be made by laminating two kinds of layers which have the same constitutions except different concentrations of a n-type impurity from each other. In this case, one of the two kinds of nitride semiconductor layers is preferably an undoped layer which is not doped with a n-type impurity.

Particularly, a typical n-type contact layer in a form of a super lattice structure is made by laminating alternately nitride semiconductor layers selected from the combinations of GaN/GaN, InGaN/GaN, AlGaN/GaN and InGaN/AlGaN and either one of the nitride semiconductor layers is preferably doped with Si.

Further, in the case that the third nitride semiconductor layer is provided, it is preferable that the third nitride semiconductor layer is undoped and has a thickness of 0.1 μm or less. More preferably, the third nitride semiconductor layer has a thickness of 500 Å or less, and most preferably, 200 Å or less. The lower limit of the thickness the third nitride semiconductor layer is not particularly specified and is desirably controlled to 10 Å or more. In the case that the third nitride semiconductor layer is not a super lattice layer, but an undoped μsingle layer, the resistivity thereof is usually as high as 1.times.10.sup.−1Ω·cm or more. Therefore, when the third nitride semiconductor layer is grown to the thickness of more than 0.1 μm contrarily, Vf tends not to decrease. When the third nitride semiconductor layer is an undoped layer, the nitride semiconductor layer has a good crystallinity and the active layer which is grown thereon also has a good crystallinity, resulting in the good improvement of the output.

The n-type contact layer constituting the super lattice structure can have a carrier concentration of not less than $3\times10^{18}/cm^3$ and considering the mobility of the layer, the resistivity thereof is less than $8\times10^{-3}\Omega\cdot cm$. The resistivity of the prior n-type contact layer is limited to $8\times10^{-3}\Omega\cdot cm$, but the decrease of the resistivity can lead to the decrease of Vf, as in the case of the first nitride semiconductor device. The realizable resistivity is $6\times10^{-3}\Omega\cdot cm$ or less and more preferably, $4\times10^{-3}\Omega\cdot cm$ or less. The lower limit is not particularly specified and desirably controlled to $1\times10^{-5}\Omega\cdot cm$ or more. If the resistivity is below the lower limit, the amount of an impurity is too much and the crystallinity of the nitride semiconductor tends to deteriorate.

DETAILED DESCRIPTION OF THE INVENTION

Embodiment 1

The first light emitting device according to the present invention comprises a nitride semiconductor layer which has an at least three-layer laminated structure between the active layer and the substrate. The first nitride semiconductor layer is undoped, so as to grow a second nitride semiconductor layer which contains a n-type impurity and has a good crystallinity. If the first nitride semiconductor layer is intentionally doped with all impurity, the crystallinity thereof deteriorates and it is difficult to grow a second nitride semiconductor which has a good crystallinity. Next, the second nitride semiconductor layer is doped with a n-type impurity and has a low resistivity and a high carrier concentration, to act a contact layer for forming a n-electrode. Therefore, the resistivity of the second nitride semiconductor layer is desirably as low as possible to obtain a good ohmic contact with the n-electrode material and is preferably less than $8\times10^3\Omega\cdot cm$. Next, the third nitride semiconductor layer is also undoped. This is because the second nitride semiconductor layer which has a low resistivity and a large carrier concentration does not have a very good crystallinity. If an active layer, cladding layer and the like are grown directly on such a second nitride semiconductor layer, the crystallinity of those layers deteriorates. When the third nitride semiconductor layer which is undoped and has a good crystallinity is interposed between those layers, the third nitride semiconductor layer acts as a buffer layer for growing the active layer. Further, when an undoped layer having a relatively high resistivity is interposed between the active layer and the second layer, the leak current of the device can be prevented and the backward withstand voltage can be enhanced. And the second nitride semiconductor layer has a carrier concentration of more than $3\times10^{18}/cm^3$. An n-type impurity include IV group elements and preferably Si or Ge is used, more preferably Si.

In the first nitride semiconductor light emitting device, due to the undoped first nitride semiconductor layer between the active layer and the substrate, the second nitride semiconductor layer doped with an n-type impurity can be grown in such a manner that the crystallinity of the second nitride semiconductor is maintained. Therefore, the second nitride semiconductor layer doped with an n-type impurity which has a good crystallinity and a large thickness can be grown. Moreover, the undoped third nitride semiconductor layer acts as an underlying layer having a good crystallinity for the layer to be grown thereon. Therefore, the resistivity of the second nitride semiconductor layer can be reduced and the carrier concentration thereof can be increased, resulting in the realization of the nitride semiconductor device having an extremely high efficiency. Thus, according to the present invention, a light emitting device having a low Vf and threshold can be realized and the heating value of the device can be decreased, with the result that the device having a high reliability can be provided.

Embodiment 2

The second light emitting device according to the present invention comprises a nitride semiconductor super lattice layer as a n-type contact layer between the active layer and the substrate. This super lattice layer has a first surface and a second surface and comprises a first nitride semiconductor layer which is undoped or has a lower concentration of a n-type impurity than that of the second nitride semiconductor layer on the first surface, so as to grow a super lattice layer having a good crystallinity. The first nitride semiconductor layer is most preferably undoped and may be doped with a n-type impurity in a smaller amount than that in the second nitride semiconductor layer, because the second nitride semiconductor layer is in a super lattice structure. The n-type impurity includes IV group elements and preferably, Si or Ge is used and more preferably, Si.

Next, when the n-type contact layer is in a super lattice structure, each nitride semiconductor layer constituting the super lattice layer has a thickness of not more than the elastic stain limit and therefore, the nitride semiconductor layer having very few crystal defects can be grown. Moreover, the crystal defects developing through the first nitride semiconductor layer from the substrate can be prevented to some extent, the third nitride semiconductor layer having a good crystallinity can be grown on the super lattice layer. What is worthy of mention is that the effect similar to HEMT can be obtained.

This super lattice layer is preferably formed by laminating alternately a nitride semiconductor layer having a higher band gap energy and a nitride semiconductor layer having a band gap energy lower than that of said nitride semiconductor layer having a higher band gap energy, the two layers having different impurity concentrations. Thickness of the nitride semiconductor layer having a higher band gap energy and the nitride semiconductor layer having a lower band gap energy which constitute the super lattice layer is preferably controlled to be within 100 Å, more preferably within 70 Å and most preferably within a range from 10 to 40 Å. If the thickness of the two layers exceeds 100 Å, the nitride semiconductor layer having a higher band gap energy and the nitride semiconductor layer having a lower band gap energy become thicker than the elastic strain limit and microscopic cracks or crystal defects tend to develop in the film. While the lower limit of the thickness of the nitride semiconductor layer having a higher band gap energy and the nitride semiconductor layer having a lower band gap energy is not specified and may be of any value as long as it is monoatomic layer or thicker, it is most preferably 10 Å or greater. Further, the nitride semiconductor layer having a higher band gap energy is desirably made by growing a nitride semiconductor which includes at least Al, preferably $Al_XGa_{1-X}N$ (0<X≤1). While the nitride semiconductor layer having a lower band gap energy may be anything as long as it is a nitride semiconductor having a band gap energy lower than that of the nitride semiconductor layer having a higher band gap energy, it is preferably made of a nitride semiconductor of binary mixed crystal or ternary mixed crystal such as $Al_YGa_{1-Y}N$ (0<Y≤1, X>Y) and $In_ZGa_{1-Z}N$ (0≤Z<1) which can be grown easily and provide good quality of crystal. It is particularly preferable that the nitride semiconductor layer having a higher band gap energy is made of $Al_XGa_{1-X}N$ (0≤X<1) which does not substantially include In or Ga and the nitride semiconductor layer having a lower band gap energy is made of $In_ZGa_{1-Z}N$ (0≤Z<1) which does not substantially include Al. And for the purpose of obtaining super lattice of excellent quality of crystal, the combination of $Al_XGa_{1-X}N$ (0<X≤0.3) with the mixing proportion of Al (value of X) being not more than 0.3 and GaN is most preferable.

When the second nitride semiconductor layer constitute a cladding layer which functions as a light trapping layer and a carrier trapping layer, it must have a band gap energy higher than that of a quantum well layer of the active layer. A nitride semiconductor layer having a higher band gap energy is made of a nitride semiconductor of high mixing proportion of Al. It has been very difficult to grow a crystal of nitride semiconductor of high mixing proportion of Al according to the prior art, because of cracks which are likely to develop in a thick film. In the case of a super lattice layer according to the present invention, however, cracks are made less likely to occur because the crystal is grown to a thickness within the elastic strain limit, even when a single layer constituting the super lattice layer is made with a somewhat high mixing proportion of Al. With this configuration, a layer having a high mixing proportion of Al can be grown with good quality of crystal and therefore, effects of light trapping and carrier trapping can be enhanced, resulting in reducing the threshold voltage in the laser device and reducing Vf (forward voltage) in the LED device.

Further, it is preferable that n-type impurity concentration is set to be different between the nitride semiconductor layer having a higher band gap energy and the nitride semiconductor layer having a lower band gap energy of the second nitride semiconductor layer. This configuration is the so-called modulation doping. When one layer is made with lower n-type impurity concentration or is preferably undoped with the impurity and the other layer is doped in a higher concentration, this modulation doping is also capable of decreasing the threshold voltage and Vf. This is because the presence of a layer having a low impurity concentration in the super lattice layer increases the mobility in the layer, and coexistence of a layer having a high concentration of impurity makes it possible to form a super lattice layer even when the carrier concentration is high. That is, it is supposed that the coexistence of a layer of low impurity concentration and high mobility and a layer of high impurity concentration and high carrier concentration allows a layer having a high impurity concentration and high mobility to be a cladding layer, thus decreasing the threshold voltage and Vf.

When a nitride semiconductor layer having a high band gap energy is doped with an impurity in a high concentration, the modulation doping effect is supposed to generate two-dimensional electron gas between a high impurity concentration layer and a low impurity concentration layer, so that the resistivity decreases due to the effect of the two-dimensional electron gas. In a super lattice layer made by laminating a nitride semiconductor layer which is doped with an n-type impurity and has a high band gap energy and an undoped nitride semiconductor layer with a low band gap energy, for example, the barrier layer side is depleted in the heterojunction interface between the layer which is doped with the n-type impurity and the undoped layer, while electrons (two-dimensional electron gas) accumulate in the vicinity of the interface on the side of the layer having a lower band gap. Since the two-dimensional electron gas is formed on the lower band gap side and therefore the electron movement is not subject to disturbance by the impurity, electron mobility in the super lattice increases and the resistivity decreases. It is supposed that the modulation doping on P side is caused by the effect of the two-dimensional positive hole gas. In the case of p layer, AlGaN has higher resistivity than that GaN has. Thus it is supposed that, because the resistivity is decreased by doping AlGaN with p type impurity in a higher concentration, a substantial decrease is caused in the resistivity of the super lattice layer, thereby making it possible to decrease the threshold value when the device is made.

When a nitride semiconductor layer having a low band gap energy is doped with an impurity in a high concentration, such an effect as described bellow is expected to be produced. When the AlGaN layer and the GaN layer are doped with the same amounts of Mg, for example, acceptor level of Mg becomes deeper and the activation ratio becomes lower in the AlGaN layer. In the GaN layer, on the other hand, acceptor level of Mg becomes less deep and the Mg activation ratio becomes higher than in the AlGaN layer. When doped with Mg in a concentration of $1\times10^{20}/cm^3$, for example, carrier concentration of about $1\times10^{18}/cm^3$ is obtained in GaN, while the concentration obtained in AlGaN is only about $1\times10^{17}/cm^3$. Hence in the present invention, a super lattice layer is made from AlGaN and GaN and the GaN layer front which higher carrier concentration can be expected is doped with greater amount of impurity, thereby forming super lattice of a high carrier concentration. Moreover, because tunnel effect causes the carrier to move through the AlGaN layer of a lower impurity concentration due to the super lattice structure, the carrier is not under substantially no influence of the AlGaN layer, while the AlGaN layer functions also as a cladding layer having a high band gap energy. Therefore, even when the nitride semiconductor layer having a lower band gap energy is doped with a greater amount of impurity, very good effect can be obtained in decreasing the threshold voltage of the laser device or LED device. The above description deals with a case of forming the super lattice layer on p-type layer side, although similar effect can be obtained also when a super lattice layer is formed on the n layer side.

When the nitride semiconductor layer having a higher band gap energy is doped with an n-type impurity in a high concentration, the amount of doping in the nitride semiconductor layer having a higher band gap energy is preferably controlled within d range from $1\times10^{17}/cm^3$ to $1\times10^{20}/cm^3$, or more preferably within a range from $1\times10^{18}/cm^3$ to $5\times10^{19}/cm^3$. When the impurity concentration is lower than $1\times10^{17}/cm^3$, the difference from the concentration in the nitride semiconductor layer having a lower band gap energy becomes too small to obtain a layer of high carrier concentration. When the impurity concentration is higher than $1\times10^{20}/cm^3$, on the other hand, leak current in the device itself tends to increase. Meanwhile the n-type impurity concentration in the nitride semiconductor layer having a lower band gap energy may be at any level as long as it is lower than that of the nitride semiconductor layer having a higher band gap energy, but it is preferably lower than one tenth of the latter. Most preferably the nitride semiconductor layer having a lower band gap energy is undoped, in which case a layer of the highest mobility can be obtained. However, because each of the component layers of a super lattice layer is thin, some of the n-type impurity diffuses from the nitride semiconductor layer having a higher band gap energy into the nitride semiconductor layer having a lower band gap energy. Therefore, the n-type impurity concentration in the nitride semiconductor layer having a lower band gap energy is preferably $1\times10^{19}/cm^3$ or less. The n-type impurity is selected from among the elements of IVB group and VIB group of the periodic table such as Si, Ge, Se, S and O, and preferably selected from among Si, Ge and S. The effect is the same also in case the nitride semiconductor layer having a higher band gap energy is doped with less amount of n-type impurity and the nitride semiconductor layer having a lower band gap energy is doped with greater amount of n-type impurity. Although, the above description deals with a case of modulation doping in which the super lattice layer is preferably doped with an impurity, it is also possible that the impurity amount in the nitride semiconductor layer having a higher band gap energy is the same as in the nitride semiconductor layer having a lower band gap energy.

In the nitride semiconductor layer constituting the super lattice layer, the layer doped with the impurity in a higher concentration is preferably doped so that such a distribution of impurity concentration is obtained, that the impurity concentration is high in the middle portion of the semiconductor layer in the direction of thickness and is low (or preferably undoped) in the portions near the both ends. When the super lattice layer is formed from the AlGaN layer doped with Si as n-type impurity and the undoped GaN layer, the AlGaN layer releases electrons as donor into the conductive band because it is doped with Si and the electrons fall in the conductive band of the GaN which has a low potential. Because the GaN crystal is not doped with the donor impurity, carrier disturbance due to an impurity does not occur. Thus the electrons can move easily in the GaN crystal, namely high electron mobility is obtained. This is similar to the effect of the two-dimensional electron gas described previously, thus increasing the mobility of the electrons substantially in the transverse direction and decreasing the resistivity. Further, the effect is enhanced when the central region of the AlGaN layer having a higher band gap energy is doped with the n-type impurity in a high concentration. That is, among the electrons that move in GaN, electrons are more or less subject to disturbance by the n-type impurity ions (Si in this case) which are present in AlGaN. However, when end portions of the AlGaN layer in the direction of thickness are undoped, electrons become less subject to the disturbance of Si, and therefore mobility in the undoped GaN layer is further improved. Similar effect is obtained also when super lattice layer is formed on the p layer side, although the action is different somewhat, and it is preferable that the nitride semiconductor layer having a higher band gap energy is doped with the p-type impurity in a higher concentration at the middle portion thereof and doped in a lower concentration or undoped at both end portions thereof. Although the impurity concentration distribution may also be realized in the nitride semiconductor layer having a lower band gap energy doped with the n-type impurity in a higher concentration, a super lattice layer made by doping the nitride semiconductor layer having a lower band gap energy in a higher concentration tends to have a less effect.

In the device according to the present invention, the third nitride semiconductor layer is also undoped or doped with an n-type impurity in a concentration lower than that in the second nitride semiconductor layer. If the third nitride semiconductor layer containing a large amount of impurity is grown directly on the top layer of the super lattice layer, the crystallinity of the third nitride semiconductor layer tends to deteriorate. Therefore, the third nitride semiconductor layer is doped with an n-type impurity in a low concentration and most preferably undoped, so as to grow b the third nitride semiconductor layer having a good crystallinity. The composition of the third nitride semiconductor layer is not matter of importance. But the third nitride semiconductor layer is preferably made of $In_XGa_{1-X}N$ (0≤X≤1), more preferably $In_XGa_{1-X}N$ (0<X≤0.5) and in such a case, the third nitride semiconductor layer acts as a buffer layer for the layers to be grown thereon, with the result that the layers above the third nitride semiconductor layer can be easily grown. Further, when the layer having a relatively high resistivity such as an undoped single layer is interposed between the active layer and the second layer, the leak current in the device can be prevented and the backward withstand voltage can be enhanced.

Example 1

Super Lattice Structure LED

Undoped GaN//Si Doped GaN (B)/Undoped GaN (A)// Undoped GaN.

Figure 1:
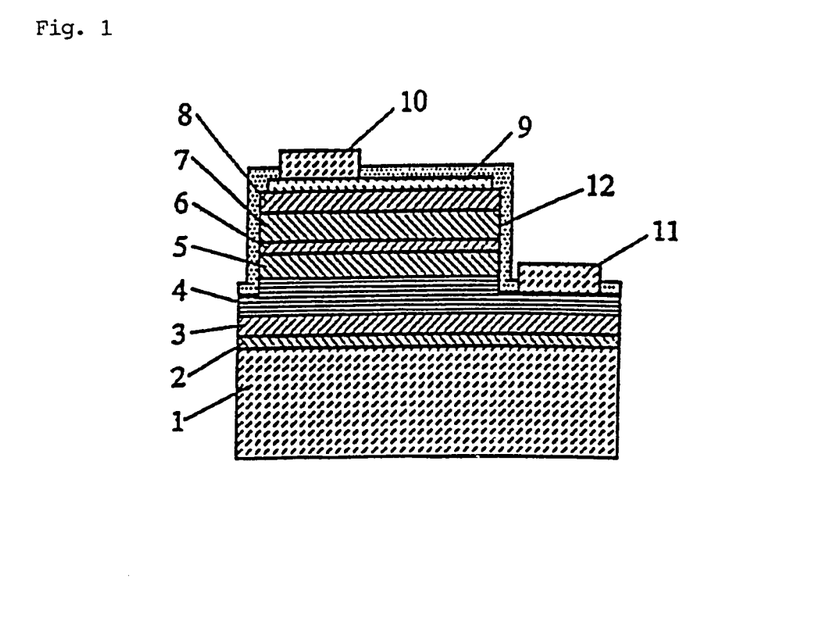
FIG. 1 is a schematic sectional view of the LED device structure of an embodiment according to the present invention.

FIG. 1 is a schematic sectional view of the LED structure of one example according to the second embodiment of the present invention. The method of manufacturing the device of the present invention will be described in conjunction with this drawing.

A C-plane sapphire substrate 1 is set in the reactor and the inside atmosphere of the reactor is fully replaced with hydrogen. The temperature of the substrate is increased to 1050° C. with hydrogen being flown in order to clean the substrate. As the substrate 1, in addition to C-plane sapphire substrate, the insulating substrate such as R- or A-plane sapphire substrate and the spinel ($MgAl_2O_4$) substrate and the semiconductor substrate such as SiC (including 6H, 4H 3C), Si, ZnO, GaAs, GaN and the like may be used.

Buffer Layer 2

Subsequently, the temperature is decreased to 510° C. A buffer layer 2 made of GaN having a thickness of about 200 Å is grown using ammonia and TMG (trimethylgallium) as a source of GaN.

First Nitride Semiconductor Layer 3

After growing the buffer layer 2, only TMG is stopped and the temperature is increased to 1050° C. At 1050° C., in the same way using ammonia and TMG as a source of GaN, a first nitride semiconductor layer 3 made of undoped GaN was grown to the thickness of 5 μm. The first nitride semiconductor layer is grown at a temperature higher than that in the case of the buffer layer, for example, at 900° C. to 1100° C. The first nitride semiconductor layer 3 can be made of $In_XAl_YGa_{1-X-Y}N$ (0≤X, 0≤Y, X+Y≤1) and the composition thereof is not a matter of importance. But preferably, the first nitride semiconductor layer is made of GaN or $Al_XGa_{1-X}N$ with X being not more than 0.2, with the result that the nitride semiconductor layer having a less crystal defects can be easily obtained. The thickness of the first nitride semiconductor layer is not a matter of importance and is larger than that of buffer layer, usually being not less than 0.1 μm. Since this layer is an undoped layer, it is similar to the intrinsic semiconductor and has a resistivity of larger than 0.2Ω·cm. The resistivity of the first nitride semiconductor layer may be decreased by doping an n-type impurity such as Si and Ge in a less amount than that in the second nitride semiconductor layer.

Second Nitride Semiconductor Layer 4

Subsequently, at 1050° C., an undoped GaN layer having a thickness of 20 Å is grown using TMG and ammonia gas. Next, at the same temperature, silane gas is added and a GaN layer doped with Si to $1\times10^{19}/cm^3$ is grown to the thickness of 20 Å. Thus, a pair of A layer made of undoped GaN layer having a thickness of 20 Å and B layer made of Si-doped GaN having a thickness of 20 Å is grown. The pair is laminated in 250 layers, resulting in a second nitride semiconductor layer 4 in the form of super lattice structure having a thickness of 1 μm.

Third Nitride Semiconductor Layer 5

Next, only silane gas is stopped and at 1050° C., in the same way, a third nitride semiconductor layer 5 made of undoped GaN is grown to the thickness of 100 Å. The third nitride semiconductor layer b can be made of $In_YAl_XGa_{1-X-Y}N$ (0≤X, 0≤Y, X+Y≤1) and the composition thereof is not a matter of importance. But preferably, the third nitride semiconductor layer is made of GaN, $Al_XGa_{1-X}N$ with X being not more than 0.2 or $In_YGa_{1-Y}N$ with Y being not more than 0.1, with the result that the nitride semiconductor layer having less crystal defects can be easily obtained. In the case of that the layer made of InGaN is grown, when the nitride semiconductor layer including Al is grown thereon, cracks are prevented from developing into the nitride semiconductor layer including Al.

Active Layer 6

Next, the temperature is decreased to 800° C. and the carrier gas is changed into nitrogen. An undoped $In_{0.4}Ga_{0.6}N$ layer having a thickness of 30 Å is grown, using TMG, TMI (trimethylindium) and ammonia to form an active layer 6 having a single quantum well structure. This layer may have a multiple quantum well structure made of InGaN.

P-Side Cladding Layer 7

Next, the temperature is increased to 1050° C. and using TMG, TMA, ammonia and Cp2Mg (cyclopentadienyl magnesium), a p-side cladding layer 7 made of p-type $Al_{0.1}Ga_{0.9}N$ doped Mg to $1\times10^{20}/cm^3$ is grown to the thickness of 0.1 μm. This layer functions as a carrier trapping layer. This layer is desirably made of a nitride semiconductor containing Al, preferably $Al_YGa_{1-Y}N$ (0<Y<1). It is desirable to grow a $Al_YGa_{1-Y}N$ layer with Y being not more than 0.3 to a thickness of not more than 0.5 μm, so as to obtain a layer having a good crystallinity.

And the p-side cladding layer 7 may be a super lattice layer. When a super lattice layer is in the p-side layer region, the thresholds are further decreased and a good result is obtained. Any layer in the p-side layer region may be a super lattice layer.

P-Side Contact Layer 8

Subsequently, at 1050° C., using TMG, ammonia and Cp2Mg, a p-side contact layer 8 made of p-type GaN doped with Mg $1\times10^{20}/cm^3$ is grown to the thickness of 0.1 μm. The p-side contact layer 8 also can be made of $In_XAl_YGa_{1-X-Y}N$ (0≤X, 0≤Y, X+Y≤1) and the composition thereof is not a matter of importance. But preferably, the p-side contact layer is made of GaN, with the result that the nitride semiconductor layer having less crystal defects can be easily obtained and a preferable ohmic contact with the p-electrode material can be achieved.

After the reaction is completed, the temperature is decreased to room temperature. Additionally, annealing is performed to the wafer at 700° C. in nitrogen atmosphere within the reactor, so as to make the p-type layers less resistive.

After annealing, the wafer is removed out of the reactor. A mask of a predetermined shape is formed on the top surface of the p-side contact layer which is an uppermost layer and etching is conducted from the p-side contact layer side with RTF (reactive ion etching) apparatus, to expose the surface of the second nitride semiconductor layer 4, as shown in FIG. 1.

After etching, a transparent p-electrode 9 containing Ni and Au and having a thickness of 200 Å is formed on the almost entire surface of the uppermost p-side contact layer and a p-pad electrode 10 made of Au for bonding is formed on the p-electrode 9. Meanwhile, a n-electrode 11 containing W and Al is formed on the surface of the second nitride semiconductor layer 4 which has been exposed by etching. Finally, an insulating film 12 made of $SiO_2$ is formed to protect the surface of the p-electrode 9, as shown in FIG. 1. Then the wafer is scribed and cleaved into LED devices which are 350 μm by 350 μm square.

For this LED device, pure green light omission of 520 nm was obtained at a forward voltage of 20 mA. Vf was decreased by 0.2 to 0.4 V and the output was enhanced by 40 to 50% at 20 mA, as compared with the conventional green light emitting LED made by laminating on the substrate a buffer layer made of GaN, n-side contact layer made of Si doped GaN, an active layer made of InGaN in the form of a single quantum well structure, a p-side cladding layer made of Mg doped AlGaN and a p-side contact layer made of Mg doped GaN sequentially. The static withstand voltage was higher than that of the conventional LED by 5 times or more.

Example 2

LED in the Form of a Super Lattice Structure

Si Doped GaN//Si-Doped GaN (B)/Undoped GaN (A)//Si Doped GaN

With the same procedures as in Example 1, the first nitride semiconductor layer 3 is made by growing GaN doped with Si to $1\times10^{19}/cm^3$ to the thickness of 3 μm and the third nitride semiconductor layer 5 is made by growing GaN doped with Si to $1\times10^{17}/cm^3$. The other constructions of the LED device were the same as in Example 1. Compared with the LED device in Example 1, the output was decreased by about 10% and Vf and static withstand voltage were almost the same.

Example 3

LED in the Form of a Super Lattice Structure

Undoped CaN//Si Doped GaN/Undoped InGaN//Undoped GaN

The LED device was fabricated in the same manner as in Example 1, except that the second nitride semiconductor was formed as follows.

That is, at 1050° C., using TMG, ammonia gas and Si gas, a GaN layer doped with Si to $1\times10^{19}/cm^3$ which has a thickness of 25 Å is grown. Subsequently, at 800° C., using TMI, TMG and ammonia gas, an undoped InGaN layer having a thickness of 75 μm is grown. In this way, A layer made of Si doped GaN layer having a thickness of 25 Å and B layer made of undoped InGaN layer having a thickness of 75 Å are laminated alternately in 100 layers, respectively, resulting in the second nitride semiconductor layer in the form of a super lattice structure having a total thickness of 2 μm.

The LED in the form of a super lattice structure of Example 3 had almost similar properties to those of Example 1.

Example 4

LED in the Form of a Super Lattice Structure

Undoped GaN//Si Doped AlGaN/Undoped GaN//Undoped GaN

With the same procedure as in Example 1, the second nitride semiconductor layer 4 is made by laminating alternately A layer made of undoped GaN layer having a thickness of 40 Å and B layer made of $Al_{0.1}Ga_{0.9}N$ layer doped Si to $1 \times 10^{18}/cm^3$ evenly which has a thickness of 60 Å, in 300 layers, respectively, resulting in a super lattice structure having a total thickness of 3 μm. Other constructions of the LED device are the same as in Example 1. The LED had almost similar properties to those of

Example 5

LD in the Form of a Super Lattice Structure

Undoped InGaN//Si Doped GaN (B)/Undoped GaN (A)/Undoped GaN

Figure 2:
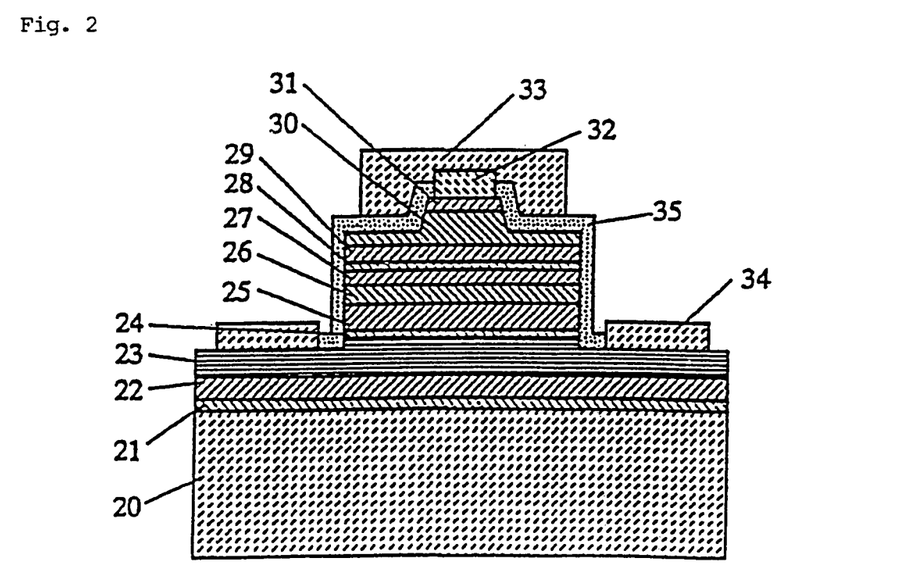
FIG. 2 is a schematic sectional view of the LED device structure of another embodiment according to the present invention.

FIG. 2 is a schematic sectional view showing the structure of the laser device according to another example of the present invention. In this drawing, the device which is cut in the parallel direction to the resonating plane of the emission is shown. Example 5 will be described with reference to FIG. 2.

With the same procedure as in Example 1, on the C-plane sapphire substrate, a buffer layer 21 made of GaN having a thickness of 200 Å, a first nitride semiconductor layer 22 made of undoped GaN having a thickness of 5 μm, a second nitride semiconductor layer 23 in the form of a super lattice structure having a total thickness of 3 μm made by laminating A layer made of undoped GaN layer having a thickness of 20 Å and B layer made of Si doped GaN having a thickness of 20 Å are grown (the second nitride semiconductor layer 4 has the same construction as that of Example 1).

Other substrate than the sapphire may be used. On the substrate made of other materials than nitride semiconductor like sapphire, a first GaN layer is grown. A protective film on which a nitride semiconductor such as $SiO_2$ cannot be easily gown is formed partially on the first GaN layer. A second nitride semiconductor layer is grown on the first nitride semiconductor layer via the protective film and thus, the second nitride semiconductor layer is grown in the transverse direction on $SiO_2$. The second nitride semiconductor layer links with each other in the transverse direction. The second nitride semiconductor layer obtained in this way is most preferably used as a substrate, so as to achieve a good crystallinity of the nitride semiconductor. When this nitride semiconductor substrate is used as a substrate, the buffer layer is not needed to be grown.

Third Nitride Semiconductor Layer 24

At 800° C., using TMI, TMG and ammonia, a third nitride semiconductor layer made of undoped $In_{0.05}Ga_{0.95}N$ is grown to the thickness of 500 Å.

N-Side Cladding Layer 25

Next, at 1050° C., a n-type $Al_{0.2}Ga_{0.8}N$ layer doped with Si to $1 \times 10^{19}/cm^3$ which has a thickness of 20 Å and an undoped GaN layer having a thickness of 20 Å are laminated alternately, in 200 layers, resulting in a super lattice structure having a total thickness of 0.8 μm. The n-side cladding layer 254 functions as a carrier trapping layer and light trapping layer and is preferably made of a nitride semiconductor containing Al, more preferably AlGaN. The total thickness of the super lattice layer is preferably controlled within the range of from 100 Å to 2 μm, more preferably within the range of from 500 Å to 2 μm. Moreover, the concentration of an impurity is high in the middle portion of the n-side cladding layer and low in both end portions thereof.

N-Side Optical Waveguide Layer 26

Subsequently, an n-side optical guide layer 26 made of n-type GaN doped with Si to $1 \times 10^7/cm^3$ is grown to the thickness of 0.1 μm. This n-side optical waveguide layer functions as an optical waveguide layer for the active layer and is desirably made of GaN and InGaN. The thickness of the n-side optical waveguide layer is usually not more than 5 μm, preferably 200 Å to 1 μm. This n-side optical waveguide layer is usually doped with an n-type impurity such as Si and Ge to have a n-type conductivity and particularly, may be undoped.

Active Layer 27

Next, at 800° C., an active layer 27 is made by laminating alternately a well layer which is made of undoped $In_{0.2}Ga_{0.8}N$ and has a thickness of 25 Å and a barrier layer which is made of undoped $In_{0.01}Ga_{0.95}N$ and has a thickness of 50 Å, thereby forming a layer of a multiple quantum well structure (MQW) having a total thickness 175 Å.

P-Side Cap Layer 28

Next, at 1050° C., a p-side cap layer 28 which has a band gap energy higher than that of the p-side optical waveguide layer 8 and that of the active layer 6 and is made of p-type $Al_{0.3}Ga_{0.7}N$ doped with Mg to $1 \times 10^{20}/cm^3$ is grown to the thickness of 300 Å. The p-side cap layer 28 is doped with a p-type impurity, but the thickness thereof is small and therefore the p-side cap layer may be of i-type wherein carriers are compensated by doping n-type impurity, preferably may be undoped and most preferably may be doped with a p-type impurity. The thickness of the p-side cap layer 28 is controlled within 0.1 μm, more preferably within 500 Å and most preferably within 300 Å. When grown to a thickness greater than 0.1 μm, cracks tend to develop in the p-side cap layer 28 making it difficult to grow a nitride semiconductor layer of good quality of crystal. In the case of AlGaN having a high proportion of Al, the small thickness can make it for LD device to oscillate easily. When $Al_yGa_{1-y}N$ has Y value of not less than 0.2, the thickness is desirably control led within 500 Å. The lower limit of the thickness of the p-side cap layer 76 is not specified and but the thickness is preferably 10 Å or more.

P-Side Optical Waveguide Layer 29

Next, a p-side optical waveguide layer 29 which has a band gap energy lower than that of the p-side cap layer 28 and is made of p-type GaN doped with Mg to $1 \times 10^{19}/cm^3$ is grown to a thickness of 0.1 μm. This layer functions as an optical waveguide layer for the active layer and is desirably made of GaN and InGaN as in the case of the n-side optical waveguide layer 26. This p-side-optical waveguide layer also functions as a buffer layer when the p-side cladding layer 30 is grown. The thickness of the p-side optical waveguide layer is preferably 100 Å to 5 μm, more preferably 200 Å to 1 μm. The p-side optical waveguide layer is usually to doped with a p-type impurity such as Mg to have a p-type conductivity, but may not be doped with an impurity.

P-Side Cladding Layer 30

Next, a p-side cladding layer 30 is made by laminating alternately a p-type $Al_{0.2}Ga_{0.2}N$ layer which is doped with Mg to $1 \times 10^{20}/cm^3$ and has a thickness of 20 Å and a p-type GaN layer which is doped with Mg to $1 \times 10^{19}/cm^3$ and has a thickness of 20 Å, thereby forming a super lattice layer having a total thickness 0.8 μm. This layer functions as a carrier trapping layer, as in the case of n-side cladding layer 25. Also this layer functions to decrease the resistivity in the p-type layers due to the super lattice structure. The thickness of the p-side cladding layer 30 is not specified and desirably is within the range of from 100 Å to 2 μm, more preferably within the range of from 500 Å to 1 μm. The concentration of an impurity may be high in the middle portion of the p-side cladding layer and low in both end portions thereof.
P-Side Contact Layer 31

Finally, a p-side contact layer 10 made of p-type GaN doped with Mg to $2\times10^{20}/cm^3$ is grown to the thickness of 150 Å. It is advantageous that the thickness of the p-side contact layer is controlled to not more than 500 Å, preferably not more than 400 Å and not less than 20 Å, so as to decrease the resistivity of the p-type layers and decrease the threshold voltage.

After the completion of the reaction, the wafer is annealed at 700° C. within the nitrogen atmosphere in the reactor to make the p-type layers less resistive. After annealing, the wafer is removed out of the reactor and as shown in FIG. 2, the p-side contact layer 31 and the p-side cladding layer 30 which are the uppermost layers are etched with RIE apparatus into a ridge geometry with a stripe width 4 μm.

After the ridge geometry is formed, as shown in FIG. 2, the p-side cladding layer 30 which is exposed on both sides of the ridge stripe is etched to expose the surface of the second nitride semiconductor layer 23 on which the n-electrode is to be formed. The exposed surface is made of a super lattice layer having a large amount of impurity.

Next, the p-electrode 32 made of Ni/Au is formed on the entire surface of the ridge. Next, as shown in FIG. 2, an insulating film 35 made of SiO, is formed on the surface of the p-side cladding layer 30 and the p-side contact layer 31 except for the p-electrode 32. A p-pad electrode 33 which is connected electrically to the p-electrode 32 via the insulating film 35 is formed. Meanwhile, the n-electrode made of W and Al is formed on the surface of the n-side contact layer 4 which has been exposed.

After the electrode is formed, the back surface of the sapphire substrate of the wafer is polished to the thickness of about 50 μm. And then, the wafer is cleaved at the M-plane of sapphire and the bar with the cleaved facet being a resonator plane is fabricated. The bar is scribed and separated parallel to the stripe electrode to fabricate a laser device. The resulting laser device configuration is shown in FIG. 2. When this laser device was oscillated continuously at room temperature, the threshold current density was decreased to about 2.0 kA/cm² and the threshold voltage was about 4.0V, compared to the conventional nitride semiconductor laser device which could oscillate continuously for 37 hours. The lifetime was 500 hours or longer.

Example 6

LED in the Form of a Super Lattice Structure

Undoped GaN//Undoped AlGaN/Si Doped GaN//Undoped GaN

With the same procedures as in Example 1, the second nitride semiconductor layer 4 is made by laminating a GaN layer which is doped with Si to $1\times10^{19}/cm^3$ and has a thickness of 20 Å and an undoped $Al_{0.10}Ga_{0.09}N$ layer having a thickness of 20 Å and growing such a pair in 250 times, thereby forming a super lattice layer having a total thickness of 1.0 μm (10000 Å). The other constructions are the same as in Example 1. The similar results were obtained to those in Example 1.

As described above, the nitride semiconductor device according to the present invention is made by laminating the first nitride semiconductor layer which is undoped or has a small concentration of impurity, the second nitride semiconductor layer of a super lattice layer which has a large concentration of impurity and the third nitride semiconductor layer which is undoped or has a small concentration of impurity and therefore, the LED which has low Vf and the laser device which has low thresholds can be obtained. Moreover, since the second nitride semiconductor layer has a low resistivity, the ohmic contact can be easily obtained between the n-electrode and the second nitride semiconductor layer and Vf is decreased. LED and the laser device have been described in this specifications, the present invention can be applied to any device made of nitride semiconductor such as light receiving devices and solar cells, as well as power devices using the output of the nitride semiconductor.

Example 7

LED in the Form of a Three Layer Laminated Structure

Undoped GaN//Si Doped N-Type GaN//Undoped GaN

This LED is fabricated in the same manner as in Example 1, as shown in FIG. 1, an example of LED device of the first embodiment according to the present invention, except that the n-type contact layer is made in the form of the three layer laminated structure. Therefore, only the n-type contact layer of the three layer laminated structure will be described.
First Nitride Semiconductor Layer 3

In the same manner as in Example 1, after the growth of the buffer layer 2, only TMG is stopped and the temperature is increased to 1050° C. At 1050° C., using TMG and ammonia gas as source gas, a first nitride semiconductor layer 3 made of undoped GaN is grown to the thickness of 1.5 μm. The first nitride semiconductor layer is grown at a temperature higher than that in the case of the buffer layer, for example, at 90 to 1100° C. The composition of the first nitride semiconductor layer is not a matter of importance, but preferably is made of $Al_XGa_{1-X}N$ with X being not more than 0.2, with the result that the nitride semiconductor layer having less crystal defects can be easily obtained. The thickness thereof is not a matter of importance, but is larger than that of the buffer layer and usually is within the range of from 0.1 to 20 μm. Since this layer is an undoped layer, it is similar to the intrinsic semiconductor and has a resistivity of larger than 0.1Ω·cm. Since the first nitride semiconductor layer is grown at a temperature higher than that in the case of the buffer layer, this layer is undoped, although this layer is different from said butter layer.
Second Nitride Semiconductor Layer 4

Subsequently, at 1050° C., using TMG and ammonia gas and silane gas as an impurity, a Si doped GaN layer is grown to the thickness of 3 μm. The second nitride semiconductor layer 3 can be made of $In_XAl_YGa_{1-Y}N$ (0≤X, 0≤Y, X+Y≤1) and the composition thereof is not a matter of importance, preferably GaN, $Al_XGa_{1-N}$ with X being not more than 0.2 or $In_YGa_{1-Y}N$ with Y being not more than 0.1, with the result that the nitride semiconductor layer having less crystal defects can be easily obtained. The thickness of the second nitride semiconductor layer is not a matter of importance and preferably is within the range of from 0.1 to 20 μm, because the n-electrode is formed thereon. In the case that using the other sapphire substrate which was not in the device structure, the nitride semiconductor layers were grown to a GaN layer in the same manner, the carrier density was $1\times10^{19}/cm^3$ and the resistivity was $5\times10^{-3}$Ω·cm.

Third Nitride Semiconductor Layer 5

Next, silane gas is stopped and at 1050° C., a third nitride semiconductor layer 5 made of undoped GaN is grown to the thickness of 0.15 μm, in the same manner. The third nitride semiconductor layer 5 can also be made of $In_xAl_yGa_{1-y}N$ (0≤X, 0≤Y, X+Y≤1) and the composition thereof is not a matter of importance, preferably GaN, $Al_xGa_{1-x}N$ with X being not more than 0.2 or $In_yGa_{1-y}N$ with Y being not more than 0.1, with the result that the nitride semiconductor layer having less crystal defects can be easily obtained. When InGaN is grown and on said InGaN layer, the nitride semiconductor layer containing Al is grown, the cracks can be prevented from developing in the nitride semiconductor layer containing Al. When the second nitride semiconductor is made of a single nitride semiconductor, it is desirable that the first, second and third nitride semiconductor layers are made of a nitride semiconductor having the same composition, particularly GaN.

The resulting LED device emitted pure green light of 520 nm at the forward voltage of 20 mA. At 20 mA, Vf was decreased by 0.1 to 0.2V and the output was enhanced by 5 to 10%, compared with the conventional LED emitting green light which was made by laminating sequentially on a sapphire substrate, a buffer layer made of GaN, an n-side contact layer made of Si doped GaN, an active layer made of InGaN in the form of a single quantum well structure, a p-side cladding layer made of Mg doped AlGaN and a p-side contact layer made of Mg doped GaN.

Example 8

Undoped $In_{0.05}Ga_{0.95}N$//Si Doped N-Type GaN//Undoped GaN

The LD device is fabricated in the same manner as in Example 5, except for the n-type contact layer.

With the same procedures as in Example 1, the buffer layer 21 which is made of GaN and has a thickness of 200 Å is grown on the C-plane sapphire substrate 20. And then, the temperature is increased to 1020° C. and at 1020° C., a first nitride semiconductor layer 22 made of undoped GaN is grown to the thickness of 5 μm.

Subsequently, at 1020° C., using silane gas as an impurity gas, a second nitride semiconductor layer (the n-type contact layer) made of Si doped n-type GaN is grown. The resistivity of the resulting LD device was also $5 \times 10^{-3} \Omega \cdot cm$.

Third Nitride Semiconductor Layer 24

Next, at 800° C., using TMI, TMG and ammonia, a third nitride semiconductor layer made of undoped $In_{0.05}Ga_{0.95}N$ is grown to the thickness of 500 Å.

N-Side Cladding Layer 25

Next, at 1020° C., a n-side cladding layer is made by laminating alternately an n-type $Al_{0.2}Ga_{0.8}N$ layer which is doped with Si to $1 \times 10^{17}/cm^3$ and has a thickness of 40 Å and an undoped GaN layer having a thickness of 40 Å, in 40 layers, thereby forming a super lattice structure. This n-side cladding layer functions as a carrier trapping and light trapping layer.

N-Side Optical Waveguide Layer 26

Subsequently, a n-side optical waveguide layer 26 made of n-type GaN doped with Si to $1 \times 10^{19}/cm^3$ is grown to the thickness of 0.2 μm. This n-side optical waveguide layer 26 acts as an optical waveguide layer for the active layer and preferably is made of GaN or InGaN. The thickness of the n-side optical waveguide layer is usually within the range of from 100 Å to 5 μm and preferably within the range of 200 Å to 1 μm. This n-side optical waveguide layer 5 may be undoped.

Active Layer

Next, at 800° C., an well layer made of Si doped $In_{0.2}Ga_{0.8}N$ is grown to the thickness of 25 Å. Next, the molar ratio of TMI is changed and a barrier layer made of Si doped $In_{0.01}Ga_{0.99}N$ is grown to the thickness of 50 Å. This operation is repeated two times and finally, the well layer is laminated, resulting in a multiple quantum well structure (MQW).

P-Side Capping Layer 28

Next, at 1020° C., using TMG, TMA, ammonia and Cp2Mg, a p-side capping layer 28 which has a band gap energy higher than that of the active layer and is made of p-type $Al_{0.3}Ga_{0.7}N$ doped with Mg to $1 \times 10^{20}/cm^3$ is grown to the thickness of 300 Å. The p-side cap layer 28 is doped with a p-type impurity, but the thickness thereof is small and therefore the p-side cal layer may be of i-type wherein carriers are compensated by doping n-type impurity. The thickness of the p-side cap layer 28 is controlled within 0.1 μm, more preferably within 500 Å and most preferably within 300 Å. When grown to a thickness of greater than 0.1 μm, cracks tend to develop in the p-side cap layer 28 making it difficult to grow a nitride semiconductor layer of good quality of crystal. And carrier cannot pass the energy barrier by tunneling effect. Ion the case of AlGaN having a high proportion of Al, the small thickness can make it for LD device to oscillate easily. For example, in the case of $Al_yGa_{1-y}N$ with Y being not less than 0.2, the thickness is desirably controlled within 500 Å. The lower limit of the thickness of the p-side capping layer 28 is not specified, but the thickness is desirably not less than 10 Å as in the case of the laser device of Example 4.

P-Side Optical Waveguide Layer 29

Next, at 1020° C., a p-side optical waveguide layer 29 made of p-type GaN dope with Mg to $1 \times 10^{19}/cm^3$ is grown to the thickness of 0.2 μm. This layer functions as an optical waveguide layer for the active layer, as in the case of the n-side optical waveguide layer 26. This layer is desirably made of GaN or InGaN. The thickness is preferably within the range of from 100 Å to 5 μm, more preferably within the range of from 200 Å to 1 μm. The p-side optical waveguide layer is usually of p-conductivity by doping a p-type impurity such as Mg, but may be not doped with an impurity.

P-Side Cladding Layer 30

Next, at 1020° C., a p-side cladding layer 30 is made by laminating alternately a p-type $Al_{0.25}Ga_{0.75}N$ layer which is doped with Mg to $1 \times 10^{20}/cm^3$ and has a thickness of 40 Å and an undoped p-type GaN layer having a thickness of 40 Å, in 40 layers, thereby forming a super lattice layer. This layer also functions as a carried trapping layer like the n-side cladding layer 25. The resistivity and thresholds of the p-type layers tend to decrease because of the p-side cladding layer in the form of a super lattice structure.

P-Side Contact Layer 31

Finally, a p-side contact layer 31 made of p-type GaN doped with Mg to $2 \times 10^{20}/cm^3$ is grown to the thickness of 150 Å.

After the completion of the reaction, the wafer is annealed at 700° C. within the nitrogen atmosphere in the reactor to make the p-type layers less resistive. After annealing, the wafer is removed out of the reactor and as shown in FIG. 2, the p-side contact layer 31 and the p-side cladding layer 30 which are the uppermost layers are etched with RIE apparatus into a ridge geometry with a stripe width 4 μm. Particularly, when the nitride semiconductor layers containing Al which are above the active layer are formed in the ridge geometry, the emission from the active layer focuses under the stripe ridge, with the result that the transverse mode is easily simplified and the thresholds are easily decreased. After the ridge is formed, a mask is formed on the ridge and as shown in FIG. 2, the surface of the second nitride semiconductor layer 23 on which n-electrode 34 is to be formed is exposed symmetrically relative to the stripe ridge.

Next, the p-electrode 32 made of Ni/Au is formed on the entire surface of the ridge. Meanwhile, an n-electrode made of Ti and Al is formed on the almost entire surface of the second nitride semiconductor layer 23 of a stripe. The almost entire surface means the area having 80% or more of the surface. Thus, it is extremely advantageous in decreasing the thresholds to expose the second nitride semiconductor layer 23 symmetrically relative to the p-electrode 32 and provide with an n-electrode on the almost entire surface of the second nitride semiconductor layer 23. Next, an insulating film 35 made of $SiO_2$ is formed between the p-electrode and the n-electrode. A p-pad electrode 33 made of Au is formed which is connected electrically to the p-electrode 32 via the insulating film 35.

After the electrode is formed, the back surface of the sapphire substrate of the wafer is polished to the thickness of about 50 μm. And then, the polished plane is scribed and the wafer is cleaved into bars perpendicularly with respect to the stripe electrode to fabricate a resonator on the cleaved facet. A dielectric film made of $SiO_2$ and $TiO_2$ is formed on the facet of the resonator and finally, the bar is cut parallel to the p-electrode, resulting in laser devices. The resulting device is onto the heat sink. When the laser oscillation was tried at room temperature, the continuous emission at a wavelength of 405 nm was observed The threshold current density was 2.5 kA/cm² and the threshold voltage was 4.0V. The lifetime was 500 hours or longer and enhanced 10 times or more, compared with the conventional nitride semiconductor laser device.

Example 9

LED in the Form of the Three Layer Laminated Structure

Undoped $In_{0.05}Ga_{0.95}$ N//Si Doped N-Type GaN//Undoped GaN

The LED device is fabricated in the same manner as in Example 1, except that a third nitride semiconductor layer made of undoped $In_{0.05}Ga_{0.95}N$ is grown to the thickness of 20 Å using TMG, TMI and ammonia at 800° C. The resulting LED device had almost the same properties as those in Example 7.

For the three layer laminated structure, the principal object is that the carrier concentration in the second nitride semiconductor layer which functions as a n-type contact layer is increased, resulting in obtaining the contact layer which has an as low resistivity as possible. Therefore, the first nitride semiconductor layer may be doped with an n-type impurity within the range where the decrease of the resistivity in the second nitride semiconductor layer is not substantially influenced. The second nitride semiconductor layer is doped with an n-type impurity in high concentration and the third nitride semiconductor layer is formed in order that the n-type cladding layer, the active layer and the like which are formed over the second nitride semiconductor layer may have a good crystallinity. It should be understood that the doping of an impurity within the range where the object of the invention can be achieved be within the scope of the present invention. When the first or third nitride semiconductor is substantially doped with Si to not more than $1\times10^{17}/cm^3$, the occurrence of leak current and a little decrease of the output is observed, but the resulting device can be practically useful (see the following Example 9 or 11). Such a phenomenon can be applied to the case of the n-type contact layer in the form of a super lattice structure. Therefore, in the structure of undoped InGaN/Si doped n-type GaN or super lattice structure/undoped GaN, or undoped GaN/Si doped n-type GaN or super lattice structure/undoped GaN of tie above-mentioned Examples, at least either first or third nitride semiconductor layer may be doped with an n-type impurity, as long as the second nitride semiconductor layer is not substantially influenced.

Example 10

LED in the Form of a Super Lattice Three Layer Laminated Structure

Undoped InGaN/Undoped GaN//Si Doped GaN//Undoped GaN

With the same procedures as in Example 1, the buffer layer 2 is formed and then the first nitride semiconductor layer 3 made of undoped GaN is grown to the thickness of 1.5 μm on the same conditions as in Example 1.

Next, at 1050° C., using TMG, ammonia gas and Si gas, a second nitride semiconductor layer 4 is formed by growing a Si doped GaN layer doped with Si to $1\times10^{19}/cm^3$ to the thickness of 2.25 μm.

And then, at 1050° C., using TMG and ammonia gas, an undoped GaN layer is grown to the thickness of 20 Å and subsequently, at 800° C., using TMI, TMG and ammonia gas, an undoped InGaN layer is grown to the thickness 10 μm. Thus, a third nitride semiconductor layer is made by laminating alternately A layer made of an undoped GaN layer with the thickness of 20 Å and B layer made of undoped InGaN layer with the thickness of 10 Å, in 20 layers, respectively, thereby forming a super lattice structure having a total thickness of 600 Å. Other constructions are the same as those in Example 1.

The resulting LED of Example 10 had the same properties as those in Example 7.

Example 11

LED in the Form of a Three Layers Laminated LED

Undoped GaN//Si Doped N-Type GaN//Si Doped GaN

With the same procedures as in Example 7, the first nitride semiconductor layer 3 is doped with Si to $1\times10^{17}/cm^3$, the second nitride semiconductor layer made of GaN 4 is doped with $8\times10^{18}/cm^3$, and the third nitride semiconductor layer 5 is an undoped layer. The other constructions are the same as in Example 7. In the resulting device, a little leak current was observed and the output decreased a little.

Example 12

LED in the Form of Three Layers Laminated Structure

Si Doped GaN//Si Doped N-Type GaN//Undoped GaN

With the same procedures as in Example 7, the third nitride semiconductor layer 5 is doped with Si to $1\times10^7/cm^3$, the second nitride semiconductor layer made of GaN 4 is doped with $8\times10^{18}/cm^3$, and the first nitride semiconductor layer 5 is an undoped layer. The other constructions are the same as in Example 7. In the resulting device, a little leak current was observed and the output decreased a little.

Example 13

LED in the Form of Three Layer Laminated Structure

Si Doped GaN//Si Doped N-Type GaN//Si Doped GaN

With the same procedures as in Example 7, the first and third nitride semiconductor layers 3 and 5 are doped with Si to $8\times10^{16}/cm^3$, and the second nitride semiconductor layer made of GaN 4 is doped with $5\times10^{18}/cm^3$. The other constructions are the same as in Example 7. In the resulting device, almost no leak current was observed and the output decreased a little.

Example 14

LED in the Form of Super Lattice Three Layers Laminated Structure

Undoped GaN/Si Doped GaN//Si Doped GaN//Undoped GaN

With the same procedures as in Example 1, the buffer layer 2 is formed and then, the first nitride semiconductor layer 3 made of undoped GaN is grown to the thickness of 1.5 μm on the same conditions as in Example 1.

Next, at 1050° C., using TMG, ammonia gas and Si gas, the second nitride semiconductor layer 4 is formed by growing Si doped GaN layer which is doped with Si to $1\times10^{19}/cm^3$ to the thickness of 25 μm.

Subsequently, at 1050° C., using TMG and ammonia gas, an undoped GaN layer is grown to the thickness of 75 μm. At the same temperature, using TMG, ammonia gas and Si gas, a Si doped GaN layer which is doped with Si to $1\times10^{19}/cm^3$ to the thickness of 25 Å. Thus, the third nitride semiconductor layer is formed by laminating alternately an undoped GaN layer having a thickness of 75 Å and the Si doped GaN layer having a thickness of 25 Å, thereby forming the super lattice structure having a total thickness of 600 Å.

The otter constructions are the same as in Example 1.

The resulting LED in the form of the super lattice structure according to the Example 14 had similar properties to those in Example 7.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed:

1. A nitride semiconductor light emitting device comprising:
   at least a substrate;
   a buffer layer formed on said substrate;
   an n-type contact layer doped with an n-type impurity for forming an n-electrode, the n-type contact layer being made of a single layer and having a thickness not less than 0.1 μm and not more than 20 μm;
   an active layer where electrons and holes are recombined; and
   a p-type contact layer for forming a p-electrode, each layer being made of nitride semiconductor,
   wherein said n-type contact layer has a first surface on which a first undoped nitride semiconductor layer is directly formed and a second surface on which a second undoped nitride semiconductor layer is directly formed to make a three-layer laminated structure without any other intermediate layers, said three-layer laminated structure being situated between said buffer layer and said active layer.

2. A nitride semiconductor light emitting device according to claim 1, wherein the second undoped nitride semiconductor layer has a thickness of more than 10 nm.

3. A nitride semiconductor light emitting device according to claim 1, wherein said n-type contact layer is formed of GaN doped with Si as an n-type impurity, and said first undoped nitride semiconductor layer joined to the first surface of said n-type contact layer is formed of GaN or AlGaN while said second undoped nitride semiconductor layer joined to the second surface of said n-type contact layer is formed of one of GaN, AlGaN and InGaN.

4. A nitride semiconductor light emitting device according to claim 3, wherein said n-type contact layer has a carrier density of more than $3\times10^{18}/cm^3$.

5. A nitride semiconductor light emitting device according to claim 3, wherein said n-type contact layer has a resistivity of less than $8\times10^{-3}$ ohm cm.

6. A nitride semiconductor light emitting device according to claim 4, wherein said n-type contact layer has a resistivity of less than $8\times10^{-3}$ ohm cm.

7. A nitride semiconductor light emitting device according to claim 2, wherein said n-type contact layer has a carrier density of more than $3\times10^{18}/cm^3$.

8. A nitride semiconductor light emitting device according to claim 2, wherein said n-type contact layer has a resistivity of less than $8\times10^{-3}$ ohm cm.

9. A nitride semiconductor light emitting device according to claim 7, wherein said n-type contact layer has a resistivity of less than $8\times10^{-3}$ ohm cm.

* * * * *

UNITED STATES PATENT AND TRADEMARK OFFICE
CERTIFICATE OF CORRECTION

PATENT NO. : 8,592,841 B2
APPLICATION NO. : 12/068063
DATED : November 26, 2013
INVENTOR(S) : Nakamura et al.

It is certified that error appears in the above-identified patent and that said Letters Patent is hereby corrected as shown below:

On the title page item "(75) Inventors: Shuji Nakamura, Tokushima (JP); Takashi Mukai, Tokushima (JP); Koji Tanizawa, Tokushima (JP); Tomotsugu Mitani, Tokushima (JP); Hiroshi Marui, Tokushima (JP)"

Should be: --(75) Inventors: Shuji Nakamura, Tokushima (JP); Takashi Mukai, Tokushima (JP); Koji Tanizawa, Tokushima (JP); Tomotsugu Mitani, Tokushima (JP); Hiromitsu Marui, Tokushima (JP)--

Signed and Sealed this
Twenty-second Day of April, 2014

Michelle K. Lee
*Deputy Director of the United States Patent and Trademark Office*